US012376409B2

United States Patent
Lee

(10) Patent No.: US 12,376,409 B2
(45) Date of Patent: Jul. 29, 2025

(54) IMAGE SENSOR AND A METHOD OF FABRICATING THE SAME

(71) Applicant: SAMSUNG ELECTRONICS CO., LTD., Suwon-si (KR)

(72) Inventor: Jaewoong Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 17/950,214

(22) Filed: Sep. 22, 2022

(65) Prior Publication Data

US 2023/0170371 A1 Jun. 1, 2023

(30) Foreign Application Priority Data

Nov. 30, 2021 (KR) .................. 10-2021-0168746

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01); *H10F 39/8053* (2025.01); *H10F 39/8063* (2025.01); *H10F 39/811* (2025.01)

(58) Field of Classification Search
CPC .......... H01L 27/1463; H01L 27/14621; H01L 27/14627; H01L 27/14636; H01L 27/14643; H01L 27/14689; H01L 27/1464; H01L 27/14683
USPC ....................................................... 257/292
See application file for complete search history.

(56) References Cited

U.S. PATENT DOCUMENTS

| | | | |
|---|---|---|---|
| 8,227,288 B2 | 7/2012 | Wang et al. | |
| 8,390,089 B2 | 3/2013 | Chen et al. | |
| 8,928,784 B2 | 1/2015 | Watanabe et al. | |
| 9,202,882 B2 | 12/2015 | Henson et al. | |
| 9,466,629 B2 | 10/2016 | Yoon et al. | |
| 10,658,410 B2 | 5/2020 | Cheng et al. | |
| 11,088,191 B2 | 8/2021 | Ogawa | |
| 2017/0047363 A1 | 2/2017 | Choi et al. | |
| 2018/0061873 A1* | 3/2018 | Lee | H01L 27/14621 |
| 2018/0182806 A1 | 6/2018 | Jin et al. | |
| 2019/0252425 A1* | 8/2019 | Ogawa | H10F 39/014 |
| 2020/0219928 A1 | 7/2020 | Park et al. | |
| 2020/0279877 A1* | 9/2020 | Kim | H10F 39/80377 |
| 2021/0183920 A1 | 6/2021 | Lee et al. | |
| 2021/0193706 A1 | 6/2021 | Kim et al. | |

(Continued)

*Primary Examiner* — Eva Y Montalvo
*Assistant Examiner* — Nicholas B Michaud
(74) *Attorney, Agent, or Firm* — MORGAN, LEWIS & BOCKIUS LLP

(57) ABSTRACT

An image sensor including: a substrate having a first surface and a second surface, which are opposite to each other, and pixel regions; and a deep isolation pattern extended from the first surface into the substrate and between the pixel regions, wherein the deep isolation pattern includes a semiconductor pattern penetrating the substrate and an insulating pattern between the substrate and the semiconductor pattern, the insulating pattern includes a side portion on a side surface of the semiconductor pattern and a bottom portion on a bottom surface of the semiconductor pattern, the bottom portion of the insulating pattern has a first thickness, the side portion of the insulating pattern has a second thickness, and the first thickness is larger than the second thickness.

20 Claims, 19 Drawing Sheets

(56) References Cited

U.S. PATENT DOCUMENTS

2022/0359583 A1\* 11/2022 Huang ................ H10F 39/8053
2023/0068723 A1\* 3/2023 Hsieh .................. H01L 27/1463

\* cited by examiner

IMAGE SENSOR AND A METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0168746, filed on Nov. 30, 2021, in the Korean Intellectual Property Office, the disclosure of which is incorporated by reference herein in its entirety.

TECHNICAL FIELD

The present disclosure relates to an image sensor and a method of fabricating the same, and in particular, to a complementary metal oxide semiconductor (CMOS) image sensor and a method of fabricating the same.

DISCUSSION OF RELATED ART

An image sensor is a semiconductor device that detects and conveys information used to make an image. There is an increasing demand for high-performance image sensors in a variety of applications such as digital cameras, camcorders, personal communication systems, gaming machines, security cameras, micro-cameras for medical applications, and/or robots. The two main types of image sensors are: a charge coupled device (CCD) type and a complementary metal-oxide-semiconductor (CMOS) type. The CMOS-type image sensor may be referred to as a "CIS" device. The CIS device includes a plurality of two-dimensionally-arranged pixels. Each of the pixels includes a photodiode (PD) that coverts incident light into an electrical signal. A deep isolation pattern may be disposed between adjacent pixels.

SUMMARY

An embodiment of the inventive concept provides an image sensor, which is configured to suppress a dark current issue, and a method of fabricating the same.

An embodiment of the inventive concept provides an image sensor, which can be highly and easily integrated, and a method of fabricating the same.

According to an embodiment of the inventive concept, an image sensor includes: a substrate having a first surface and a second surface, which are opposite to each other, and a plurality of pixel regions; and a deep isolation pattern extended from the first surface into the substrate and interposed between the plurality of pixel regions, wherein the deep isolation pattern includes a semiconductor pattern penetrating the substrate and an insulating pattern interposed between the substrate and the semiconductor pattern, the insulating pattern includes a side portion on a side surface of the semiconductor pattern and a bottom portion on a bottom surface of the semiconductor pattern, the bottom portion of the insulating pattern has a first thickness, which is measured from the bottom surface of the semiconductor pattern in a direction perpendicular to the second surface of the substrate, the side portion of the insulating pattern has a second thickness, which is measured from the side surface of the semiconductor pattern in a direction parallel to the second surface of the substrate, and the first thickness is larger than the second thickness.

According to an embodiment of the inventive concept, an image sensor includes: a substrate having a first surface and a second surface, which are opposite to each other, and a plurality of pixel regions, which are arranged in a first direction and a second direction that are parallel to the second surface and cross each other; a deep isolation pattern extended from the first surface into the substrate in a third direction perpendicular to the second surface and interposed between the plurality of pixel regions; and an isolation pattern extended from the second surface into the substrate in the third direction and interposed between the plurality of pixel regions, wherein the deep isolation pattern and the isolation pattern are overlapped with each other in the third direction, the deep isolation pattern includes a semiconductor pattern, which penetrates the substrate, and an insulating pattern, which is extended along a side surface and a bottom surface of the semiconductor pattern, the insulating pattern includes a side portion on the side surface of the semiconductor pattern and a bottom portion on the bottom surface of the semiconductor pattern, the bottom portion of the insulating pattern has a first thickness measured from the bottom surface of the semiconductor pattern in the third direction, the side portion of the insulating pattern has a second thickness measured from the side surface of the semiconductor pattern in a direction parallel to the second surface of the substrate, and the first thickness is larger than the second thickness.

According to an embodiment of the inventive concept, a method of fabricating an image sensor includes: forming a deep trench in a substrate having a first surface and a second surface, which are opposite to each other, the deep trench extended from the first surface into the substrate; forming an oxide layer in a portion of the substrate exposed by a bottom surface of the deep trench; forming a sidewall insulating layer to conformally cover a side surface and the bottom surface of the deep trench; and forming a semiconductor pattern on the sidewall insulating layer to fill a lower region of the deep trench, wherein the oxide layer is formed in the substrate exposed by the bottom surface of the deep trench.

DETAILED DESCRIPTION OF THE EMBODIMENTS

Example embodiments of the inventive concept will now be described more fully hereinafter with reference to the accompanying drawings.

Figure 1:
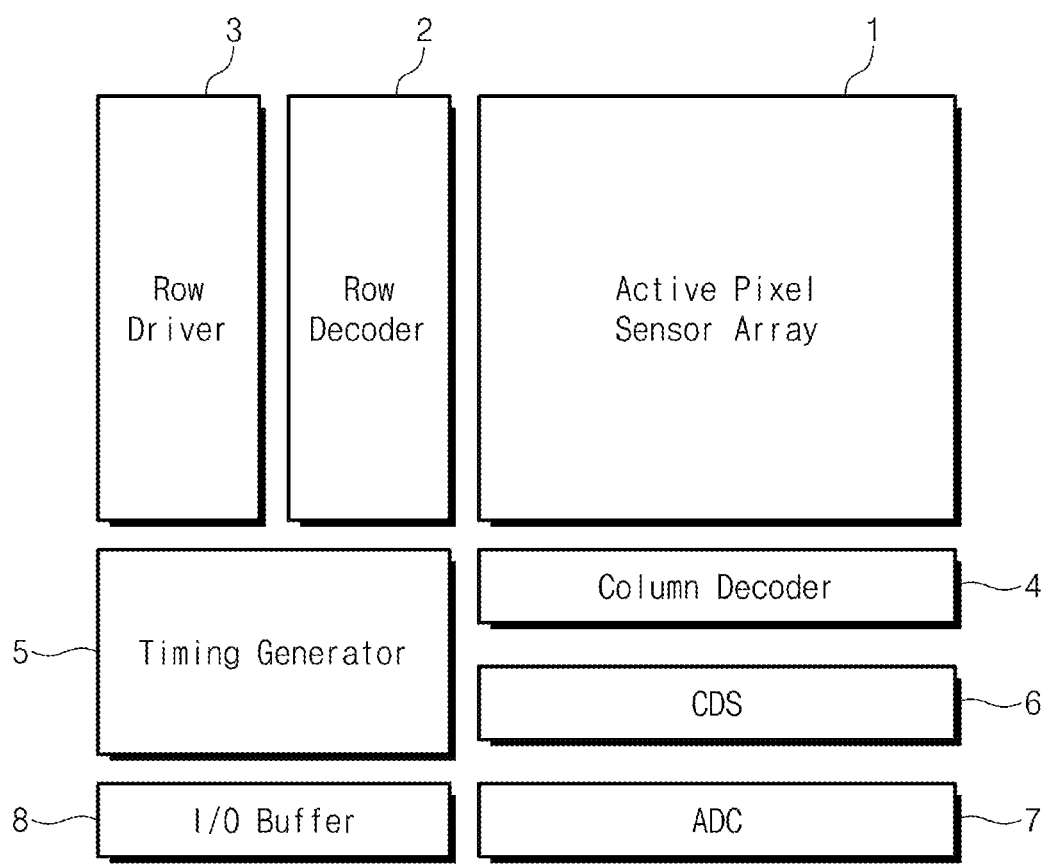
FIG. 1 is a block diagram schematically illustrating an image sensor according to an embodiment of the inventive concept.

FIG. 1 is a block diagram schematically illustrating an image sensor according to an embodiment of the inventive concept.

Referring to FIG. 1, an image sensor may include an active pixel sensor array 1, a row decoder 2, a row driver 3, a column decoder 4, a timing generator 5, a correlated double sampler (CDS) 6, analog-to-digital converter (ADC) 7, and an input/output (I/O) buffer 8.

The active pixel sensor array I may include a plurality of pixels, which are two-dimensionally arranged and are used to convert optical signals to electrical signals. The active pixel sensor array I may be driven by a plurality of driving signals (e.g., pixel selection signals, reset signals, and charge transfer signals) provided from the row driver 3. In addition, the electrical signals, which are converted by the active pixel sensor array 1, may be provided to the CDS 6.

The row driver 3 may provide a plurality of driving signals, which are used to drive the pixels, to the active pixel sensor array 1, based on results decoded by the row decoder 2. In the case where the pixels are arranged in a matrix shape, the driving signals may be applied to respective rows of the pixels.

The timing generator 5 may be configured to provide a timing signal and a control signal to the row decoder 2 and the column decoder 4.

The CDS 6 may be configured to receive the electric signals generated by the active pixel sensor array 1 and to perform a holding and sampling operation on the received electric signals. In addition, the CDS 6 may be configured to perform a double sampling operation on a specific noise level and a signal level of the electric signal and then to output a difference level corresponding to a difference between the noise and signal levels.

The ADC 7 may be configured to convert an analog signal, which contains information on the difference level outputted from the CDS 6, to a digital signal and to output the converted digital signal.

The I/O buffer 8 may be configured to latch the digital signals and then to sequentially output the latched signals to an image signal processing unit, based on the result decoded by the column decoder 4.

Figure 2:
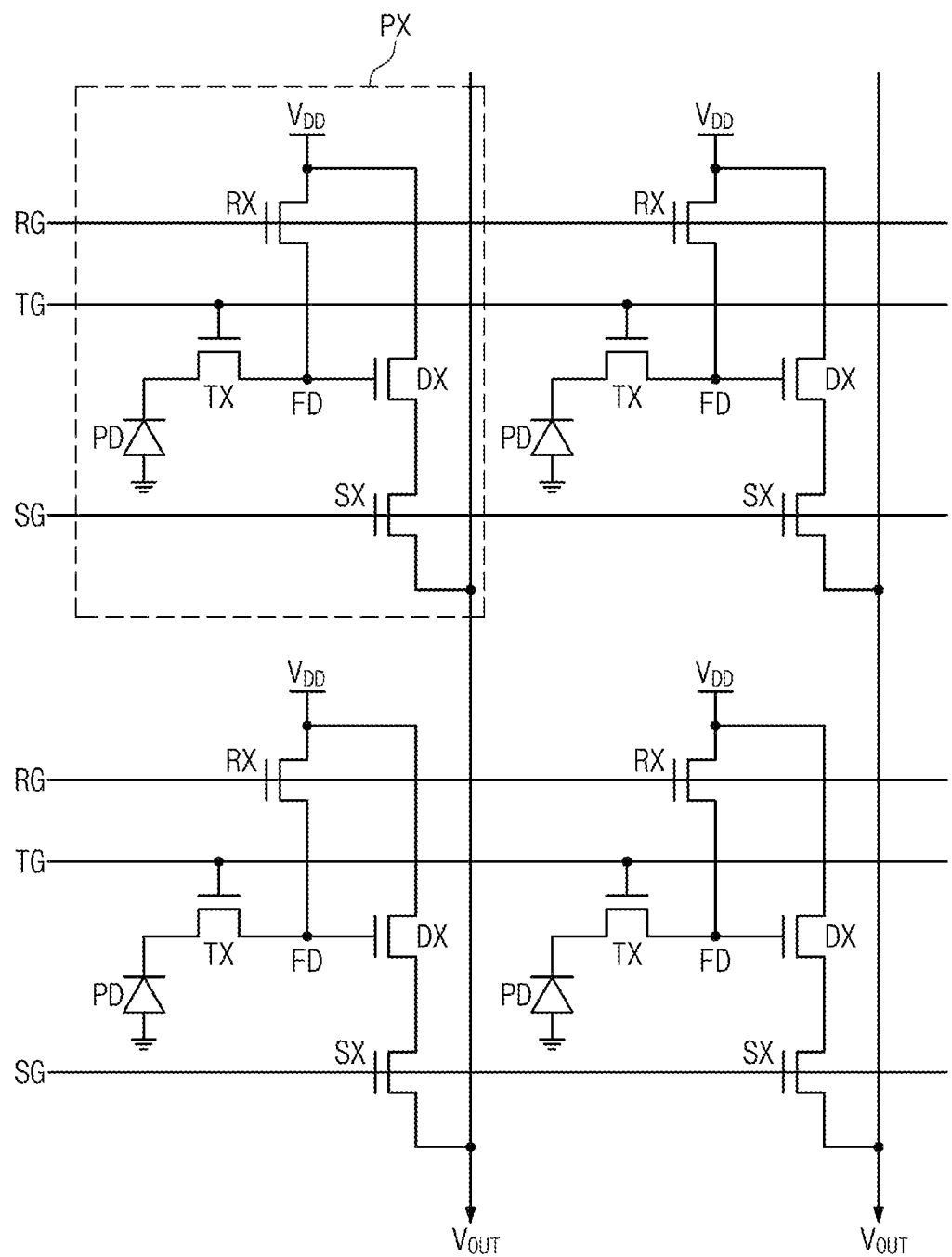
FIG. 2 is a circuit diagram illustrating an active pixel sensor array of an image sensor according to an embodiment of the inventive concept.

FIG. 2 is a circuit diagram illustrating an active pixel sensor array of an image sensor according to an embodiment of the inventive concept.

Referring to FIGS. 1 and 2, the active pixel sensor array 1 may include a plurality of pixels PX, which are arranged in a matrix shape. Each of the pixels PX may include a transfer transistor TX and logic transistors RX, SX, and DX. The logic transistors may include a reset transistor RX, a selection transistor SX, and a drive transistor DX. The transfer transistor TX, the reset transistor RX, and the selection transistor SX may include a transfer gate TG, a reset gate RG, and a selection gate SG, respectively. Each of the pixels PX may further include a photoelectric conversion device PD and a floating diffusion region FD.

The photoelectric conversion device PD may be configured to generate and hold photocharges whose amount is in proportion to an amount of light incident from the outside. The photoelectric conversion device PD may be a photodiode including a p-type impurity region and an n-type impurity region. The transfer transistor TX may be configured to transfer electric charges, which are generated in the photoelectric conversion device PD, to the floating diffusion region FD. The floating diffusion region FD may be configured to receive the charges, which are generated in the photoelectric conversion device PD, and to cumulatively store the charges therein. The drive transistor DX may be controlled by an amount of the photocharges, which are stored in the floating diffusion region FD.

The reset transistor RX may be configured to periodically discharge the electric charges stored in the floating diffusion region FD. A drain electrode of the reset transistor RX may be connected to the floating diffusion region FD, and a source electrode of the reset transistor RX may be connected to a power voltage VDD. If the reset transistor RX is turned on, the power voltage VDD, which is connected to the source electrode of the reset transistor RX, may be applied to the floating diffusion region FD. Thus, the reset transistor RX may be turned on, and in this case, the electric charges stored in the floating diffusion region FD may be discharged; in other words, the floating diffusion region FD may be reset.

The drive transistor DX may be a source follower buffer amplifier. The drive transistor DX may be configured to amplify a variation in electric potential of the floating diffusion region FD and to output the amplified signal to an output line Vout.

The selection transistor SX may be used to select a row of the pixels PX to be read out during a read operation. If the selection transistor SX is turned on, the power voltage VDD may be applied to a drain electrode of the drive transistor DX.

FIG. 2 illustrates a unit pixel PX including one photoelectric conversion device PD and four transistors TX, RX, DX, and SX, but the inventive concept is not limited to this structure of the image sensor. As an example, the reset transistor RX, the drive transistor DX, or the selection transistor SX may be shared by adjacent ones of the pixels PX. In this case, an integration density of the image sensor may be increased.

Figure 3:
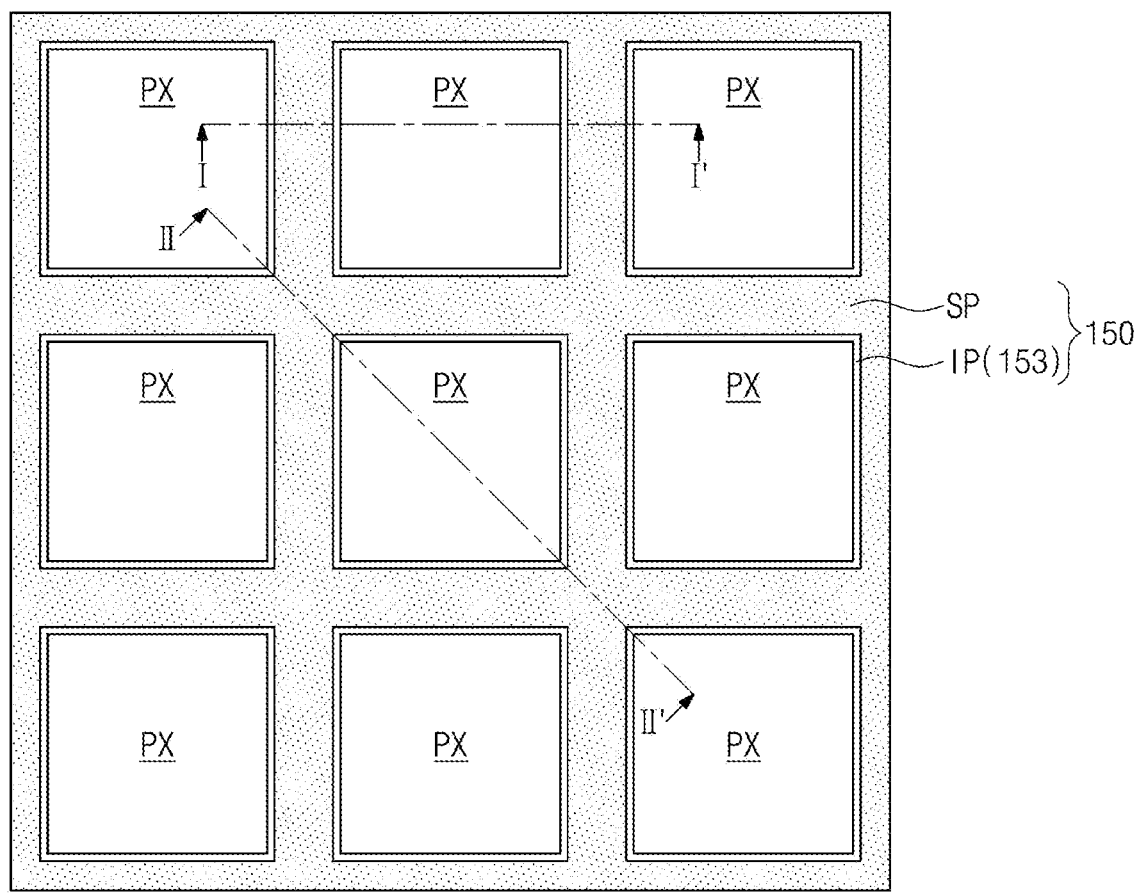
FIG. 3 is a plan view illustrating an image sensor according to an embodiment of the inventive concept.
Figure 3:
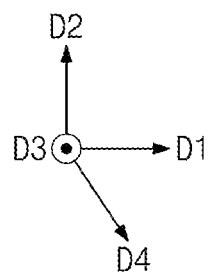
Figure 4:
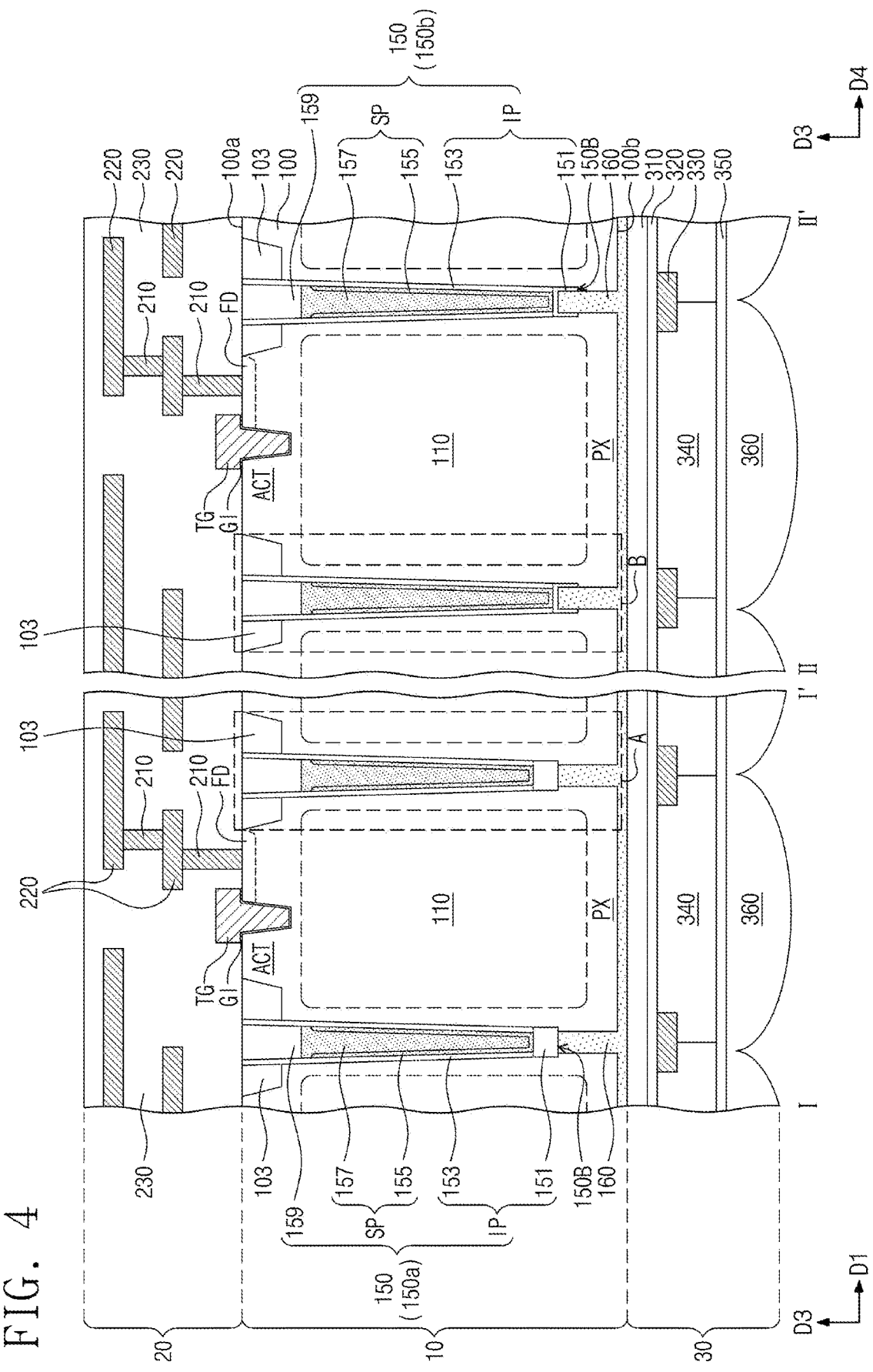
FIG. 4 is a sectional view illustrating cross-sections taken along lines I-I' and II-II' of FIG. 3.
Figure 5:
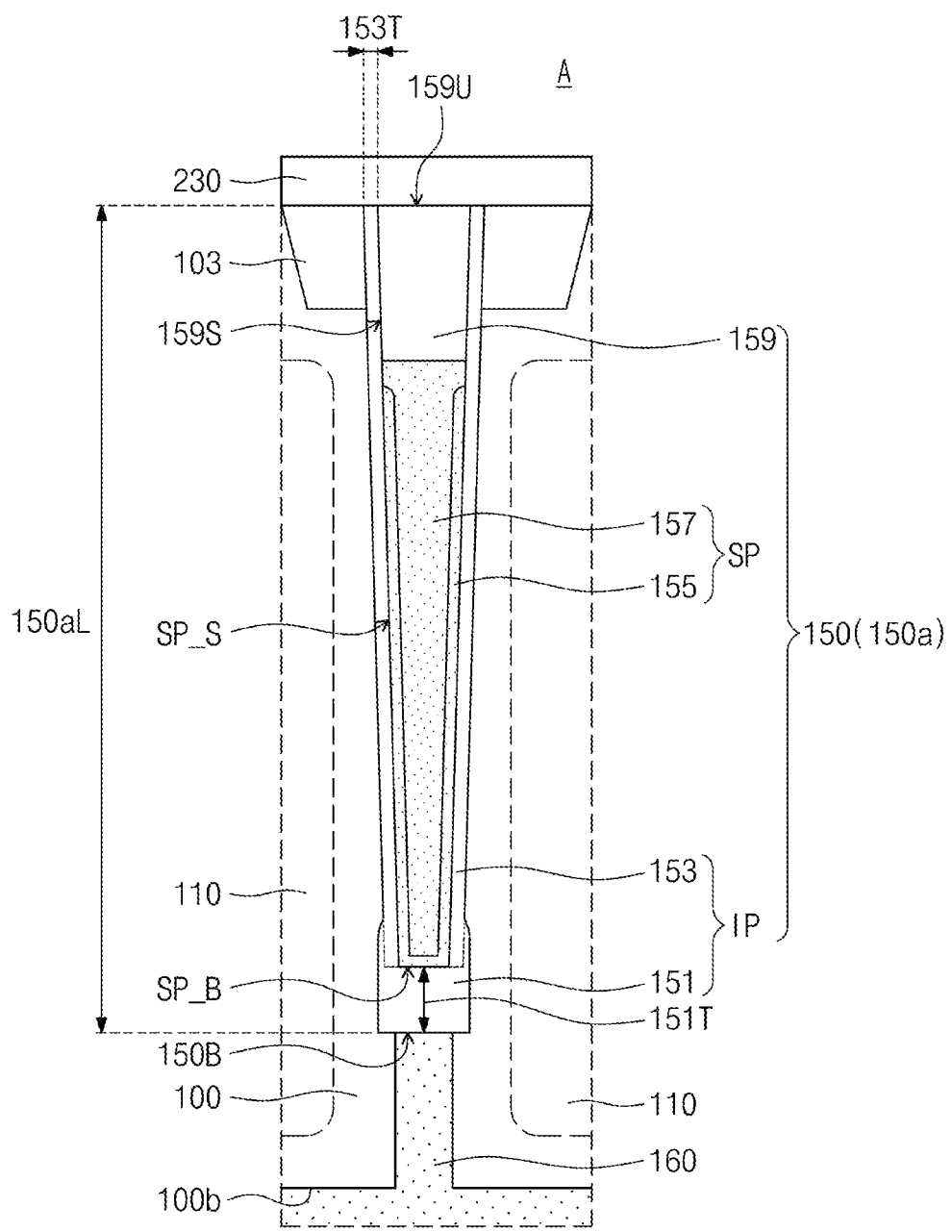
FIG. 5 is an enlarged sectional view of a portion 'A' of FIG. 4.
Figure 6:
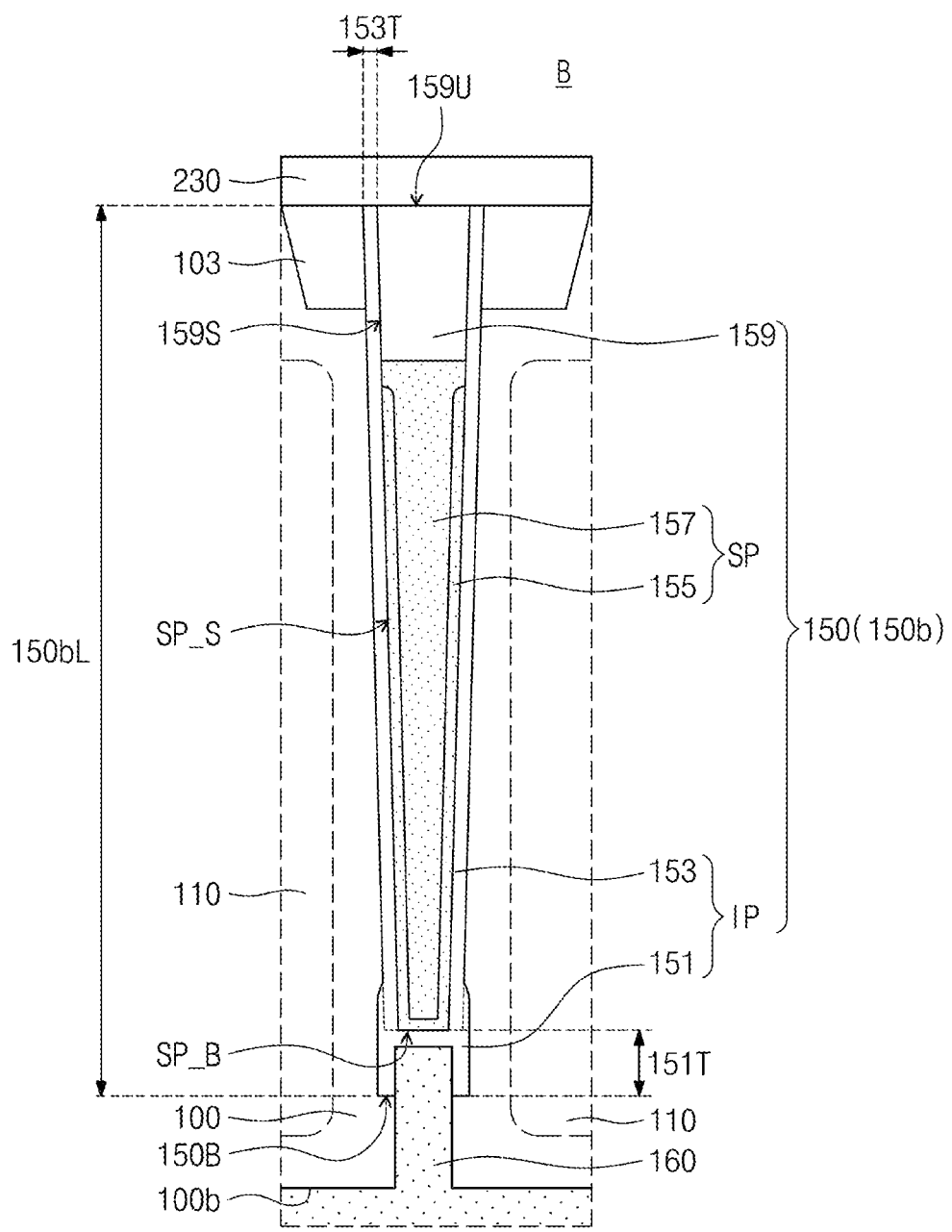
FIG. 6 is an enlarged sectional view of a portion 'B' of FIG. 4.

FIG. 3 is a plan view illustrating an image sensor according to an embodiment of the inventive concept. FIG. 4 is a sectional view illustrating cross-sections taken along lines I-I' and II-II' of FIG. 3. FIG. 5 is an enlarged sectional view of a portion 'A' of FIG. 4, and FIG. 6 is an enlarged sectional view of a portion 'B' of FIG. 4.

Referring to FIGS. 3 and 4, an image sensor may include a photoelectric conversion layer 10, an interconnection layer 20, and an optically-transparent layer 30. The photoelectric conversion layer 10 may be disposed between the interconnection layer 20 and the optically-transparent layer 30. In other words, the optically-transparent layer 30, the photoelectric conversion layer 10 and the interconnection layer 20 may be sequentially arranged.

The photoelectric conversion layer 10 may include a substrate 100, and the substrate 100 may include a plurality of pixel regions PX. The substrate 100 may be a semiconductor substrate (e.g., a silicon wafer, a germanium wafer, a silicon-germanium wafer, a II-VI compound semiconductor wafer, or a III-V compound semiconductor wafer) or a silicon-on-insulator (SOI) wafer. The substrate 100 may have a first surface 100a and a second surface 100b, which are opposite to each other. The first surface 100a may be adjacent to the interconnection layer 20 and the second surface 100b may be adjacent to the optically-transparent layer 30. The pixel regions PX may be two-dimensionally arranged in a first direction D1 and a second direction D2, which are parallel to the second surface 100b of the substrate 100. The first and second directions D1 and D2 may not be parallel to each other or may be perpendicular to each other.

The photoelectric conversion layer 10 may further include a deep isolation pattern 150 and an isolation pattern 160, which are disposed between the pixel regions PX and in the substrate 100. When viewed in a plan view, the deep isolation pattern 150 may be provided to enclose each of the pixel regions PX or to have a lattice structure. For example, the deep isolation pattern 150 may surround individual pixel regions PX in the plan view. The deep isolation pattern 150 may be provided to penetrate a portion of the substrate 100 in a third direction D3 perpendicular to the second surface 100b of the substrate 100. The deep isolation pattern 150 may be extended from the first surface 100a of the substrate 100 toward the second surface 100b of the substrate 100 and a bottom surface 150B of the deep isolation pattern 150 may be located at a height higher than the second surface 100b of the substrate 100. In the present specification, a height may be a distance from the second surface 100b of the substrate 100, which is measured in the third direction D3.

The isolation pattern 160 may be vertically overlapped with the deep isolation pattern 150 in the third direction D3 and may penetrate another portion of the substrate 100 in the third direction D3. The isolation pattern 160 may be extended from the second surface 100b of the substrate 100 toward the first surface 100a of the substrate 100. The isolation pattern 160 may be in contact with the bottom surface 150B of the deep isolation pattern 150 or may penetrate the bottom surface 150B of the deep isolation pattern 150 and extend into the deep isolation pattern 150. A portion of the isolation pattern 160 may be extended into a region on the second surface 100b of the substrate 100 to cover the second surface 100b of the substrate 100. The isolation pattern 160 may include a metal oxide or a metal fluoride, which contains at least one metal of hafnium (Hf), zirconium (Zr), aluminum (Al), tantalum (Ta), titanium (Ti), yttrium (Y), and lanthanum (La).

The deep isolation pattern 150 and the isolation pattern 160 may separate adjacent ones of the pixel regions PX from each other and may prevent cross-talk between the adjacent ones of the pixel regions PX.

The deep isolation pattern 150 may include a semiconductor pattern SP, which is provided in the substrate 100 and is extended in the third direction D3, an insulating pattern IP, which is provided between the semiconductor pattern SP and the substrate 100, and an insulating gapfill pattern 159, which is provided on the semiconductor pattern SP. The semiconductor pattern SP may be disposed between the pixel regions PX and may enclose each of the pixel regions PX, when viewed in a plan view. The insulating gapfill pattern 159 may be disposed on the semiconductor pattern SP and may enclose each of the pixel regions PX, when viewed in a plan view. The insulating pattern IP may be interposed between the semiconductor pattern SP and each of the pixel regions PX and may enclose each of the pixel regions PX, when viewed in a plan view. The insulating pattern IP may be extended into a region between the insulating gapfill pattern 159 and each of the pixel regions PX.

Referring to FIGS. 4, 5, and 6, the insulating pattern IP may be extended along a side surface SP_S and a bottom surface SP_B of the semiconductor pattern SP. The insulating pattern IP may include a side portion 153 on the side surface SP_S of the semiconductor pattern SP and a bottom portion 151 on the bottom surface SP_B of the semiconductor pattern SP. The bottom portion 151 of the insulating pattern IP may be adjacent to the bottom surface 150B of the deep isolation pattern 150. The bottommost surface of the bottom portion 151 of the insulating pattern IP may correspond to the bottom surface 150B of the deep isolation pattern 150. The side portion 153 of the insulating pattern IP may be extended from the bottom portion 151 of the insulating pattern IP to a region on the side surface SP_S of the semiconductor pattern SP and may be interposed between the side surface SP_S of the semiconductor pattern SP and each of the pixel regions PX. The side portion 153 of the insulating pattern IP may be extended from the side surface SP_S of the semiconductor pattern SP to a region on a side surface 159S of the insulating gapfill pattern 159 and may be interposed between the side surface 159S of the insulating gapfill pattern 159 and each of the pixel regions PX.

The bottom portion 151 of the insulating pattern IP may have a first thickness 151T, which is measured from the bottom surface SP_B of the semiconductor pattern SP in a direction (e.g., the third direction D3) perpendicular to the second surface 100b of the substrate 100, and the side portion 153 of the insulating pattern IP may have a second thickness 153T, which is measured from the side surface SP_S of the semiconductor pattern SP in a direction parallel to the second surface 100b of the substrate 100. The first thickness 151T of the bottom portion 151 of the insulating pattern IP may be larger than the second thickness 153T of the side portion 153 of the insulating pattern IP. In an embodiment of the inventive concept, a portion of the bottom portion 151 of the insulating pattern IP may be extended to a lower portion of the side surface SP_S of the semiconductor pattern SP to cover the lower portion of the side portion 153 of the insulating pattern IP. For example, the extended area of the bottom portion 151 may protrude toward the first surface 100a of the substrate 100. In this case, the portion of the bottom portion 151 of the insulating pattern IP may be horizontally overlapped with the lower portion of the side portion 153 of the insulating pattern IP. The insulating pattern IP may be formed of or include at least one of silicon oxide, silicon nitride, or silicon oxynitride.

The semiconductor pattern SP may include a first semiconductor pattern 155, which is adjacent to the insulating pattern IP, and a second semiconductor pattern 157, which is disposed on the insulating pattern IP with the first semiconductor pattern 155 interposed therebetween. The second semiconductor pattern 157 may be disposed on the side portion 153 and the bottom portion 151 of the insulating pattern IP. The first semiconductor pattern 155 may be interposed between the side portion 153 of the insulating pattern IP and the second semiconductor pattern 157 and may be extended into a region between the bottom portion 151 of the insulating pattern IP and the second semiconductor pattern 157. In an embodiment of the inventive concept, the second semiconductor pattern 157 may cover the topmost surface of the first semiconductor pattern 155 and may be in contact with the side portion 153 of the insulating pattern IP. For example, the second semiconductor pattern 157 may contact the side portion 153 of the insulating pattern IP at an area above the topmost surface of the first semiconductor pattern 155. Each of the first and second semiconductor patterns 155 and 157 may be formed of or include at least one of semiconductor materials doped with impurities. Each of the first and second semiconductor patterns 155 and 157 may be formed of or include a semiconductor material of p- or n-type. As an example, each of the first and second semiconductor patterns 155 and 157 may be formed of or include boron-doped poly silicon.

The insulating gapfill pattern 159 may be disposed on the first and second semiconductor patterns 155 and 157. In an embodiment of the inventive concept, the second semiconductor pattern 157 may be extended to a region between the first semiconductor pattern 155 and the insulating gapfill pattern 159 and may be in contact with the side portion 153 of the insulating pattern IP. The insulating gapfill pattern 159 may be in contact with the side portion 153 of the insulating pattern IP. The topmost surface 159U of the insulating gapfill pattern 159 may be coplanar with the first surface 100a of the substrate 100. The topmost surface 159U of the insulating gapfill pattern 159 may be located at substantially the same height as the first surface 100a of the substrate 100. The topmost surface 159U of the insulating gapfill pattern 159 may be referred to as the topmost surface of the deep isolation pattern 150. The insulating gapfill pattern 159 may be formed of or include at least one of silicon oxide, silicon nitride, or silicon oxynitride.

The deep isolation pattern 150 may have a vertical length in the third direction D3, and here, the vertical length may be a length from the bottom surface 150B of the deep isolation pattern 150 to the topmost surface of the deep isolation pattern 150 (e.g., the topmost surface 159U of the insulating gapfill pattern 159) measured in the third direction D3. The deep isolation pattern 150 may include a first deep isolation pattern 150a and a second deep isolation pattern 150b whose vertical lengths in the third direction D3 are different from each other. In an embodiment of the inventive concept, the first deep isolation pattern 150a may have a vertical length 150aL, and the second deep isolation pattern 150b may have a vertical length 150bL that is larger than the vertical length 150aL of the first deep isolation pattern 150a.

The first deep isolation pattern 150a may be a portion of the deep isolation pattern 150, which is provided between adjacent ones, in the first direction D1, of the pixel regions PX of FIG. 3 and has a line shape extending in the second direction D2, or which is provided between adjacent ones, in the second direction D2, of the pixel regions PX of FIG. 3 and has a line shape extending in the first direction D1. The second deep isolation pattern 150b may be another portion of the deep isolation pattern 150 which is provided at an intersection between the first deep isolation pattern 150a extending in the first direction D1 and the first deep isolation pattern 150a extending in the second direction D2. The second deep isolation pattern 150b may be provided between adjacent ones, in a fourth direction D4 crossing both of the first and second directions D1 and D2, of the pixel regions PX of FIG. 3. The fourth direction D4 may be parallel to the second surface 100b of the substrate 100.

The bottom surface 150B of the first deep isolation pattern 150a and the bottom surface 150B of the second deep isolation pattern 150b may be located at a height that is higher than the second surface 100b of the substrate 100. The bottom surface 150B of the second deep isolation pattern 150b may be located at a height lower than the bottom surface 150B of the first deep isolation pattern 150a, when measured from the second surface 100b of the substrate 100. This is so, because the isolation pattern 160 may protrude into the second deep isolation pattern 150b.

The isolation pattern 160 may be vertically overlapped with the first deep isolation pattern 150a in the third direction D3 and may be in contact with the bottom surface 150B of the first deep isolation pattern 150a. In the first deep isolation pattern 150a, the bottom portion 151 of the insulating pattern IP may be interposed between the bottom surface SP_B of the semiconductor pattern SP and the isolation pattern 160. The isolation pattern 160 may be vertically overlapped with the second deep isolation pattern 150b in the third direction D3 and may be extended into the second deep isolation pattern 150b through the bottom surface 150B. The isolation pattern 160 may be extended into the bottom portion 151 of the insulating pattern IP of the second deep isolation pattern 150b. In other words, the isolation pattern 160 may protrude into the bottom portion 151 of the insulating pattern IP of the second deep isolation pattern 150b. According to an embodiment of the inventive concept, in the second deep isolation pattern 150b, a portion of the bottom portion 151 of the insulating pattern IP may be interposed between the bottom surface SP_B of the semiconductor pattern SP and the isolation pattern 160.

Referring back to FIGS. 3 and 4, each of the pixel regions PX may include a photoelectric conversion region 110. The substrate 100 may have a first conductivity type, and the photoelectric conversion region 110 may be an impurity region that is of a second conductivity type different from the first conductivity type. In an embodiment of the inventive concept, the first conductivity type and the second conductivity type may be a p-type and an n-type, respectively. In this case, the impurity of the second conductivity type may contain n-type impurities (e.g., phosphorus, arsenic, bismuth, and/or antimony). The photoelectric conversion region 110 and the substrate 100 may form a pn junction serving as a photodiode. In an embodiment of the inventive concept, each of the pixel regions PX may further include an impurity region, which is adjacent to a side surface of the deep isolation pattern 150 (e.g., the side portion 153 of the insulating pattern IP). The impurity region may be a region that is doped with an impurity of the first conductivity type. The impurity region may prevent electrons, which are trapped in dangling bonds which may exist on the side surface of each of the pixel regions PXR, from entering the photoelectric conversion region 110, and this may make it possible to suppress or prevent a dark current or a white spot from occurring in the image sensor. The impurity of the first conductivity type may include a p-type impurity, such as boron. In an embodiment of the inventive concept, the semiconductor pattern SP of the deep isolation pattern 150 may be formed of or include a semiconductor material that is doped with the impurity of the first conductivity type (e.g., the p-type impurity).

A shallow isolation pattern 103 may be disposed adjacent to the first surface 100a of the substrate 100. Each of the pixel regions PX may include an active region ACT, which is defined by the shallow isolation pattern 103. The shallow isolation pattern 103 may be formed of or include at least one of silicon oxide, silicon nitride, or silicon oxynitride.

For example, the deep isolation pattern 150 may penetrate the shallow isolation pattern 103 and may extend into the substrate 100. The insulating gapfill pattern 159 may be disposed in the shallow isolation pattern 103. The insulating gapfill pattern 159 may penetrate the shallow isolation pattern 103 and be in contact with the semiconductor pattern SP. The side portion 153 of the insulating pattern IP may be extended into a region between the shallow isolation pattern 103 and the insulating gapfill pattern 159.

The transfer transistor TX and the logic transistors RX, SX, and DX of FIG. 2 may be disposed on the first surface 100a of the substrate 100. The transistors TX, RX, SX, and DX may be disposed on the active region ACT of each of the pixel regions PX.

The transfer transistor TX may include the transfer gate TG, which is provided on the active region ACT, and the floating diffusion region FD. The transfer gate TG may include a lower portion, which is partially inserted in the substrate 100, and an upper portion, which is placed at a level higher than the first surface 100a of the substrate 100. A gate dielectric layer GI may be interposed between the transfer gate TG and the substrate 100. The floating diffusion region FD may be disposed in a portion of the active region ACT located at a side of the transfer gate TG. The floating diffusion region FD may be doped to have the second conductivity type (e.g., an n-type) that is different from the first conductivity type of the substrate 100.

The drive transistor DX may include a drive gate on the active region ACT, and the selection transistor SX may include a selection gate on the active region ACT. The reset transistor RX may include a reset gate on the active region ACT. An additional gate dielectric layer may be interposed between the substrate 100 and each of the drive, selection, and reset gates.

The interconnection layer 20 may be disposed on the first surface 100a of the substrate 100. The interconnection layer 20 may include contact plugs 210, interconnection patterns 220, and an interlayer insulating layer 230, which are disposed on the first surface 100a of the substrate 100. The contact plugs 210 may be connected to terminals of the transistors TX, RX, SX, and DX. In an embodiment of the inventive concept, one of the contact plugs 210 may be connected to the floating diffusion region FD. The contact plugs 210 may be connected to corresponding ones of the interconnection patterns 220. The interconnection patterns 220 may be electrically connected to the transistors TX, RX, SX, and DX through the contact plugs 210. The interlayer insulating layer 230 may be disposed on the first surface 100a of the substrate 100 to cover the transistors TX, RX, SX, and DX, the contact plugs 210 and the interconnection patterns 220. The interlayer insulating layer 230 may include an insulating material, and the contact plugs 210 and the interconnection patterns 220 may include a conductive material.

The optically-transparent layer 30 may be disposed on the second surface 100b of the substrate 100. The optically-transparent layer 30 may include a color filter array 340 and a micro lens array 360, which are disposed on the second surface 100b of the substrate 100. The color filter array 340 may be disposed between the second surface 100b of the substrate 100 and the micro lens array 360. The optically-transparent layer 30 may be configured to condense and filter light, which is incident from the outside, and then to provide the light to the photoelectric conversion layer 10.

The color filter array 340 may include a plurality of color filters 340, which are respectively disposed on the pixel regions PX. The micro lens array 360 may include a plurality of micro lenses 360, which are respectively disposed on the color filters 340. Each of the color filters 340 and each of the micro lenses 360 may be overlapped with the photoelectric conversion region 110 of a corresponding one of the pixel regions PX vertically (e.g., in the third direction D3).

An anti-reflection layer 310 may be interposed between the second surface 100b of the substrate 100 and the color filter array 340. A portion of the isolation pattern 160 may be extended to a region on the second surface 100b of the substrate 100 to cover the second surface 100b of the substrate 100 and may be interposed between the second surface 100b of the substrate 100 and the anti-reflection layer 310. The anti-reflection layer 310 may be configured to prevent light, which is incident into the substrate 100 through the second surface 100b, from being reflected, and thus, it is possible to effectively guide the light into the photoelectric conversion region 110.

A first insulating layer 320 may be interposed between the anti-reflection layer 310 and the color filter array 340, and a second insulating layer 350 may be interposed between the color filter array 340 and the micro lens array 360. A grid 330 may be interposed between the first insulating layer 320 and the color filter array 340. The grid 330 may be overlapped with the deep isolation pattern 150 vertically (e.g., in the third direction D3). The grid 330 may be configured to guide light, which is incident into the substrate 100 through the second surface 100b, such that the light is effectively incident into the photoelectric conversion region 110. In an embodiment of the inventive concept, the grid 330 may be formed of or include at least one of metallic materials. The color filter array 340 may be extended into regions between adjacent ones of the grids 330 and may be in contact with the first insulating layer 320.

Electrons may be trapped in dangling bonds existing on a side surface of each of the pixel regions PX, and in this case, a dark current may be produced. To reduce such a dark current, a negative bias may be applied to the semiconductor pattern SP of the deep isolation pattern 150. In the case where the isolation pattern 160 passes through the bottom surface 150B of the deep isolation pattern 150 and is extended into the semiconductor pattern SP, the semiconductor pattern SP may be recessed. In this case, the negative bias may not be applied to the semiconductor pattern SP, and as a result, a dark current in the image sensor may be increased.

According to an embodiment of the inventive concept, the insulating pattern IP of the deep isolation pattern 150 may include the side portion 153 on the side surface SP_S of the semiconductor pattern SP and the bottom portion 151 on the bottom surface SP_B of the semiconductor pattern SP. The first thickness 151T of the bottom portion 151 of the insulating pattern IP may be larger than the second thickness 153T of the side portion 153 of the insulating pattern IP. The isolation pattern 160 may be in contact with the bottom surface 150B of the first deep isolation pattern 150a, which has a relatively small vertical length 150aL. The isolation pattern 160 may also be extended into the second deep isolation pattern 150b, which has a relatively large vertical length 150bL, through the bottom surface 150B, of the second deep isolation pattern 150b. Since the bottom portion 151 of the insulating pattern IP is thicker than the side portion 153 of the insulating pattern IP, at least a portion of the bottom portion 151 of the insulating pattern IP may be interposed between the bottom surface SP_B of the semiconductor pattern SP and the isolation pattern 160. Accordingly, it is possible to prevent the isolation pattern 160 from being extended into the semiconductor pattern SP and to prevent the semiconductor pattern SP from being recessed. As a result, the negative bias may be stably applied to the semiconductor pattern SP. Thus, a dark current in the image sensor may be suppressed.

In addition, as an integration density of the image sensor increases, an aspect ratio of the deep isolation pattern 150 between the pixel regions PX may be increased.

According to an embodiment of the inventive concept, the deep isolation pattern 150 and the isolation pattern 160 may be disposed between the pixel regions PX to be overlapped with each other vertically (e.g., in the third direction D3), and thus, it is possible to suppress an increase of an aspect ratio of the deep isolation pattern 150. This may make it easy to increase an integration density of the image sensor.

Figure 7:
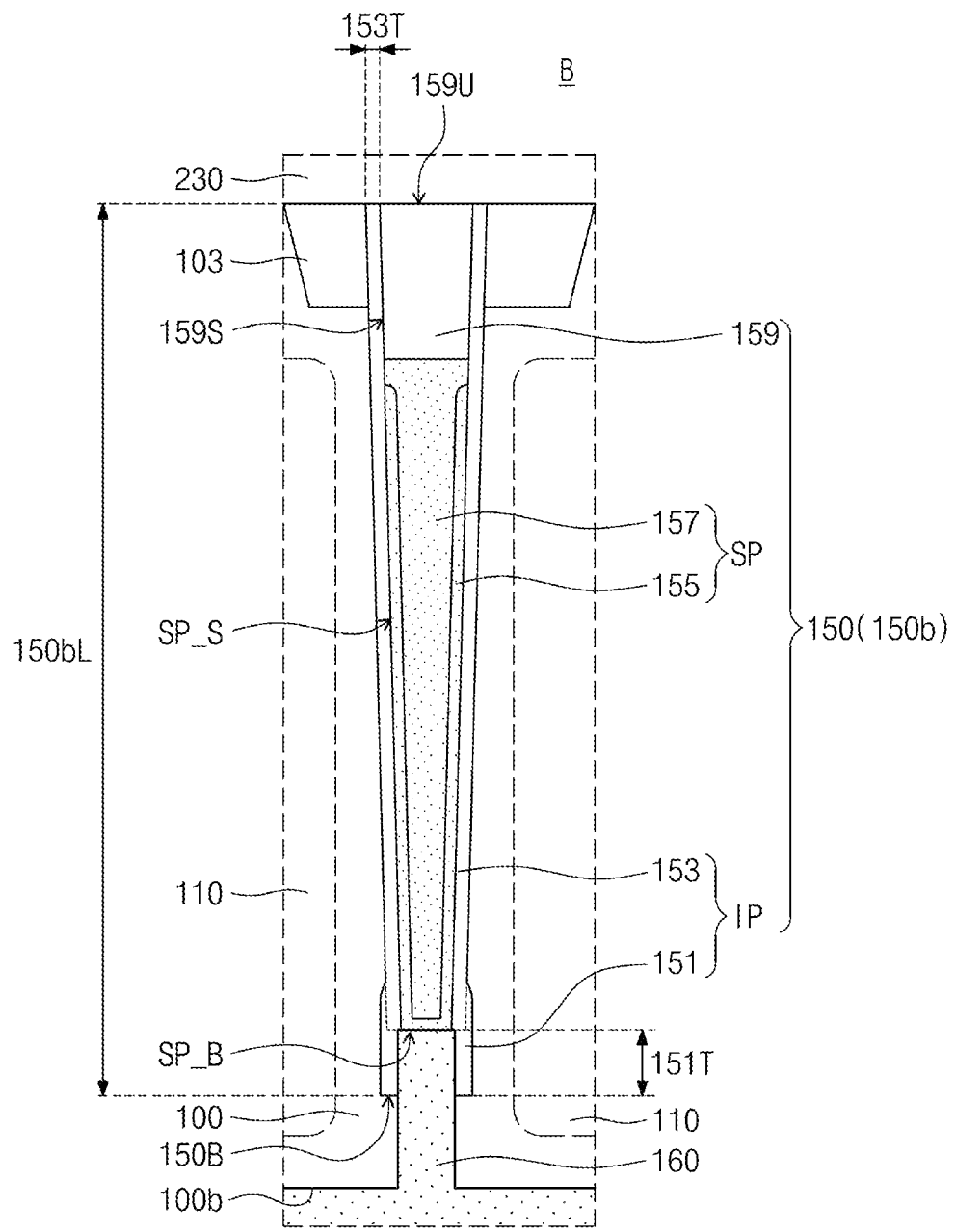
FIG. 7 is an enlarged sectional view illustrating a portion (e.g., 'B' of FIG. 4) of an image sensor according to an embodiment of the inventive concept.

FIG. 7 is an enlarged sectional view illustrating a portion (e.g., 'B' of FIG. 4) of an image sensor according to an embodiment of the inventive concept. For the sake of brevity, features, which are different from the image sensor described with reference to FIGS. 1 to 6, will be mainly described below.

Referring to FIG. 7, the isolation pattern 160 may be vertically overlapped with the second deep isolation pattern 150*b* in the third direction D3 and may be extended into the second deep isolation pattern 150*b* through the bottom surface 150B. In an embodiment of the inventive concept, the isolation pattern 160 may penetrate the bottom portion 151 of the insulating pattern IP of the second deep isolation pattern 150*b* and may be in contact with the bottom surface SP_B of the semiconductor pattern SP. In other words, unlike the embodiment shown in FIG. 6, a portion of the bottom portion 151 may not be provided between the isolation pattern 160 and the first semiconductor pattern 155. According to an embodiment of the inventive concept, since the bottom portion 151 of the insulating pattern IP is thicker than the side portion 153 of the insulating pattern IP, it is possible to prevent the isolation pattern 160 from being extended into the semiconductor pattern SP and to prevent the semiconductor pattern SP from being recessed. Accordingly, the negative bias may be stably applied to the semiconductor pattern SP, and thus, a dark current in the image sensor may be suppressed.

Except for the afore-described differences, the image sensor according to the present embodiment may be substantially the same as the image sensor described with reference to FIGS. 1 to 6.

FIGS. 8 to 15 are sectional views illustrating a method of fabricating an image sensor according to an embodiment of the inventive concept and corresponding to the lines I-I' and II-II' of FIG. 3. For the sake of brevity, the same element as in the image sensor previously described with reference to FIGS. 1 to 6 may be identified by the same reference number without repeating an overlapping description thereof.

Figure 8:
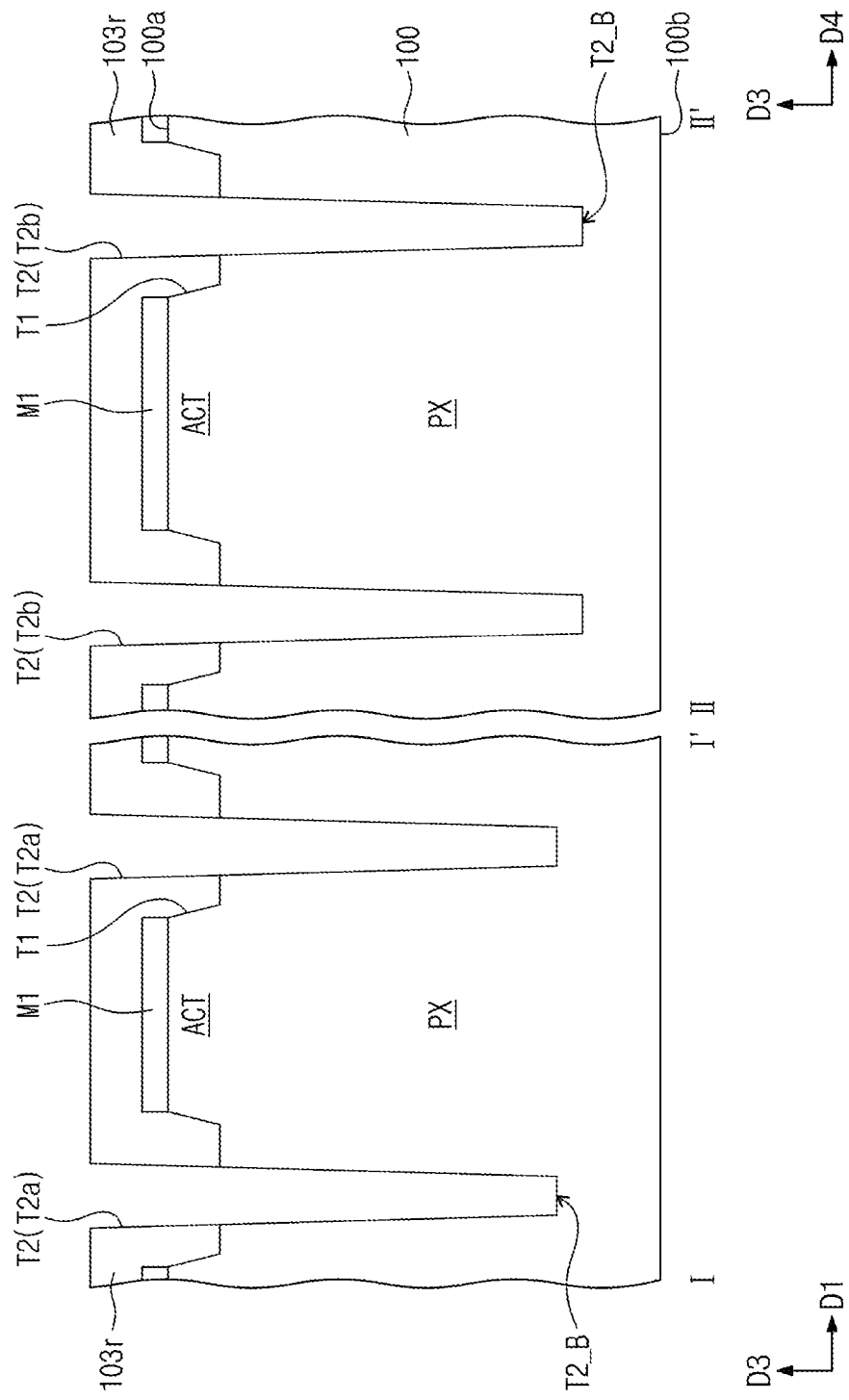
FIGS. 8, 9, 10, 11, 12, 13, 14 and 15 are sectional views illustrating a method of fabricating an image sensor according to an embodiment of the inventive concept and corresponding to the lines I-I and II-II' of FIG. 3.

Referring to FIG. 8, the substrate 100 having the first and second surfaces 100*a* and 100*b*, which are opposite to each other, may be provided. The substrate 100 may have a first conductivity type (e.g., p-type). A shallow trench T1 may be formed adjacent to the first surface 100*a* of the substrate 100. The formation of the shallow trench T1 may include forming a first mask pattern M1 on the first surface 100*a* of the substrate 100 and etching the substrate 100 using the first mask pattern M1 as an etch mask. The shallow trench T1 may define the active region ACT in the substrate 100.

A device isolation layer 103*r* may be formed on the first surface 100*a* of the substrate 100. The device isolation layer 103*r* may cover the first mask pattern M1 and may fill the shallow trench T1. The device isolation layer 103*r* may be formed of or include at least one of silicon oxide, silicon nitride, and/or silicon oxynitride.

A deep trench T2 may be formed in the substrate 100. The formation of the deep trench T2 may include forming a second mask pattern on the device isolation layer 103*r* to define a region, in which the deep trench T2 will be formed, and etching the device isolation layer 103*r* and the substrate 100 using the second mask pattern as an etch mask. A bottom surface T2_B of the deep trench T2 may be located at a height, which is higher than the second surface 100*b* of the substrate 100. The deep trench T2 may define a plurality of pixel regions PX in the substrate 100. Each of the pixel regions PX may include the active region ACT, which is defined by the shallow trench T1.

The deep trench T2 may include a first deep trench T2*a* and a second deep trench T2*b*, which have different vertical lengths from each other in the third direction D3. The vertical length of the second deep trench T2*b* may be larger than the vertical length of the first deep trench T2*a*. The first deep trench T2*a* may be provided between adjacent ones, in the first direction D1, of the pixel regions PX of FIG. 3 and may have a line shape extending in the second direction D2 or may be provided between adjacent ones, in the second direction D2, of the pixel regions PX of FIG. 3 and may have a line shape extending in the first direction D1. The second deep trench T2*b* may be formed at an intersection between the first deep trench T2*a* extending in the first direction D1 and the first deep trench T2*a* extending in the second direction D2. The second deep trench T2*b* may be formed between ones of the pixel regions PX of FIG. 3, which are adjacent to each other in the fourth direction D4.

The bottom surface T2_B of the first deep trench T2*a* and the bottom surface T2_B of the second deep trench T2*b* may be located at a height higher than the second surface 100*b* of the substrate 100. The bottom surface T2_B of the second deep trench T2*b* may be located at a height lower than the bottom surface T2_B of the first deep trench T2*a*, when measured from the second surface 100*b* of the substrate 100. In other words, the second deep trench T2*b* may be located closer to the second surface 100*b* of the substrate 100 than the first deep trench T2*a*.

Figure 9:
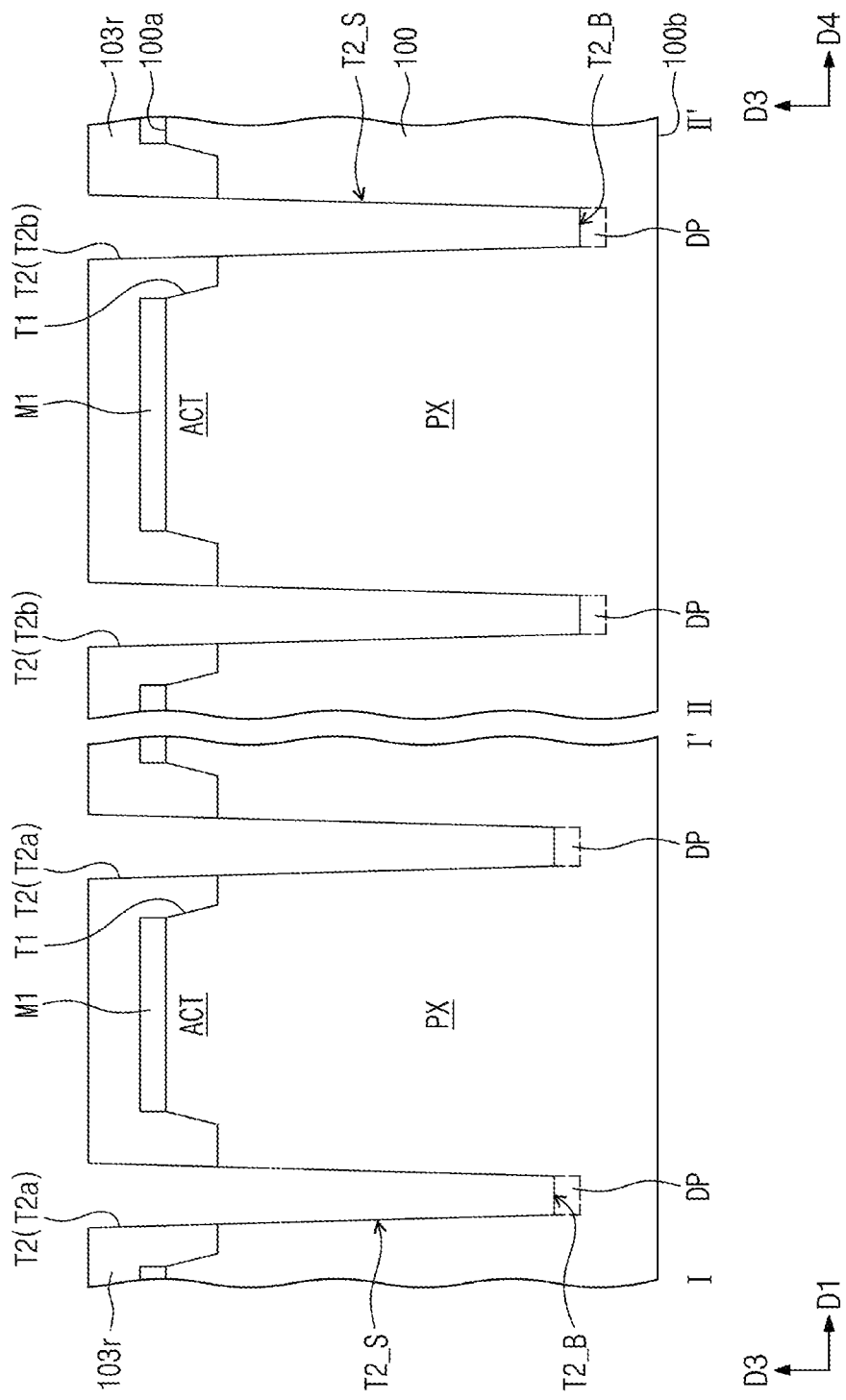

Referring to FIG. 9, a doped region DP may be formed in a portion of the substrate 100, which is exposed through the bottom surface T2_B of the deep trench T2. The doped region DP may be a region of the substrate 100 that is doped with oxygen. The formation of the doped region DP may include performing an oxygen doping process on the substrate 100, in which the deep trench T2 is formed. In an embodiment of the inventive concept, the oxygen doping process may be performed using an ion implantation method or a plasma doping (PLAD) method. During the oxygen doping process, an oxygen ion or an oxygen plasma may be anisotropically provided, and thus, the doped region DP may be locally formed in a portion of the substrate 100, which is exposed through the bottom surface T2_B of the deep trench T2. In an embodiment of the inventive concept, the doped region DP may be extended into a portion of the substrate 100, which is exposed through a lower portion of a side surface T2_S of the deep trench T2.

Figure 10:
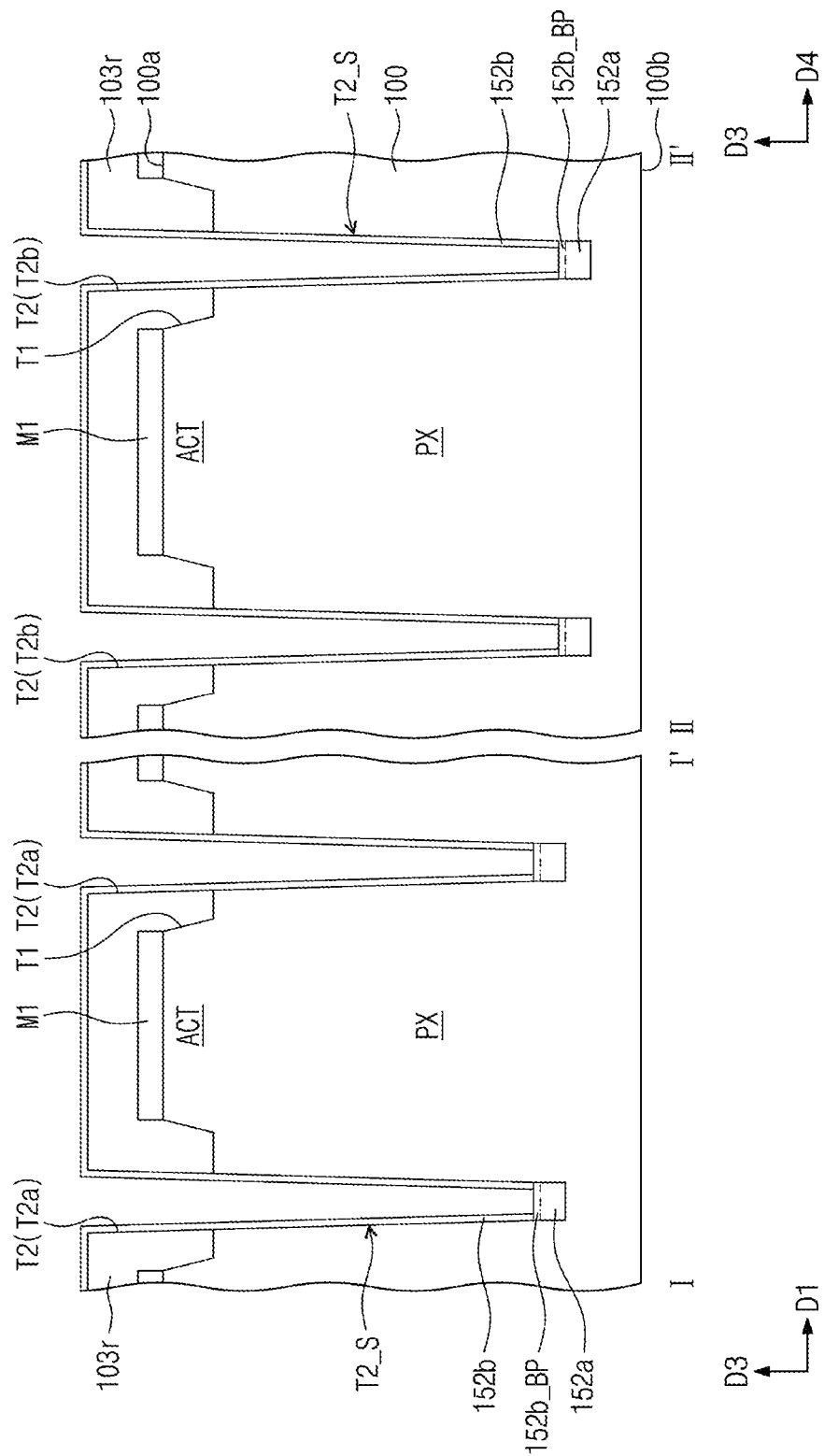

Referring to FIG. 10, the doped region DP may be oxidized by a thermal treatment process, and thus, an oxide layer 152*a* may be locally formed on the bottom surface T2_B of the deep trench T2.

In an embodiment of the inventive concept, the formation of the oxide layer 152*a* may include forming the doped region DP in the substrate 100, which is exposed through the bottom surface T2_B of the deep trench T2, and performing the thermal treatment process to oxidize the doped region DP, as described with reference to FIGS. 9 and 10. In another embodiment of the inventive concept, the formation of the oxide layer 152*a* may include performing a plasma oxidation process on the substrate 100, in which the deep trench T2 is formed, unlike that described with reference to FIGS. 9 and 10. An oxygen plasma may be anisotropically provided, during the plasma oxidation process. Accordingly, a portion of the substrate 100, which is exposed through the bottom surface T2_B of the deep trench T2, may be locally oxidized, and as a result, the oxide layer 152*a* may be locally formed on the bottom surface T2_B of the deep trench T2.

In an embodiment of the inventive concept, the oxide layer 152a may be extended into the portion of the substrate 100, which is exposed through the lower portion of the side surface T2_S of the deep trench T2.

After the formation of the oxide layer 152a, a sidewall insulating layer 152b may be formed on the device isolation layer 103r to conformally cover an inner surface of the deep trench T2. The sidewall insulating layer 152b may cover the side surface T2_S and the bottom surface T2_B of the deep trench T2 and may have a substantially uniform thickness. A bottom portion 152b_BP of the sidewall insulating layer 152b may be in direct contact with the oxide layer 152a. The oxide layer 152a may be exposed at the bottom portion 152b_BP of the sidewall insulating layer 152b. The oxide layer 152a and the sidewall insulating layer 152b may be connected to each other to form a single object. The sidewall insulating layer 152b may be formed of or include at least one of silicon oxide, silicon nitride, or silicon oxynitride.

Figure 11:
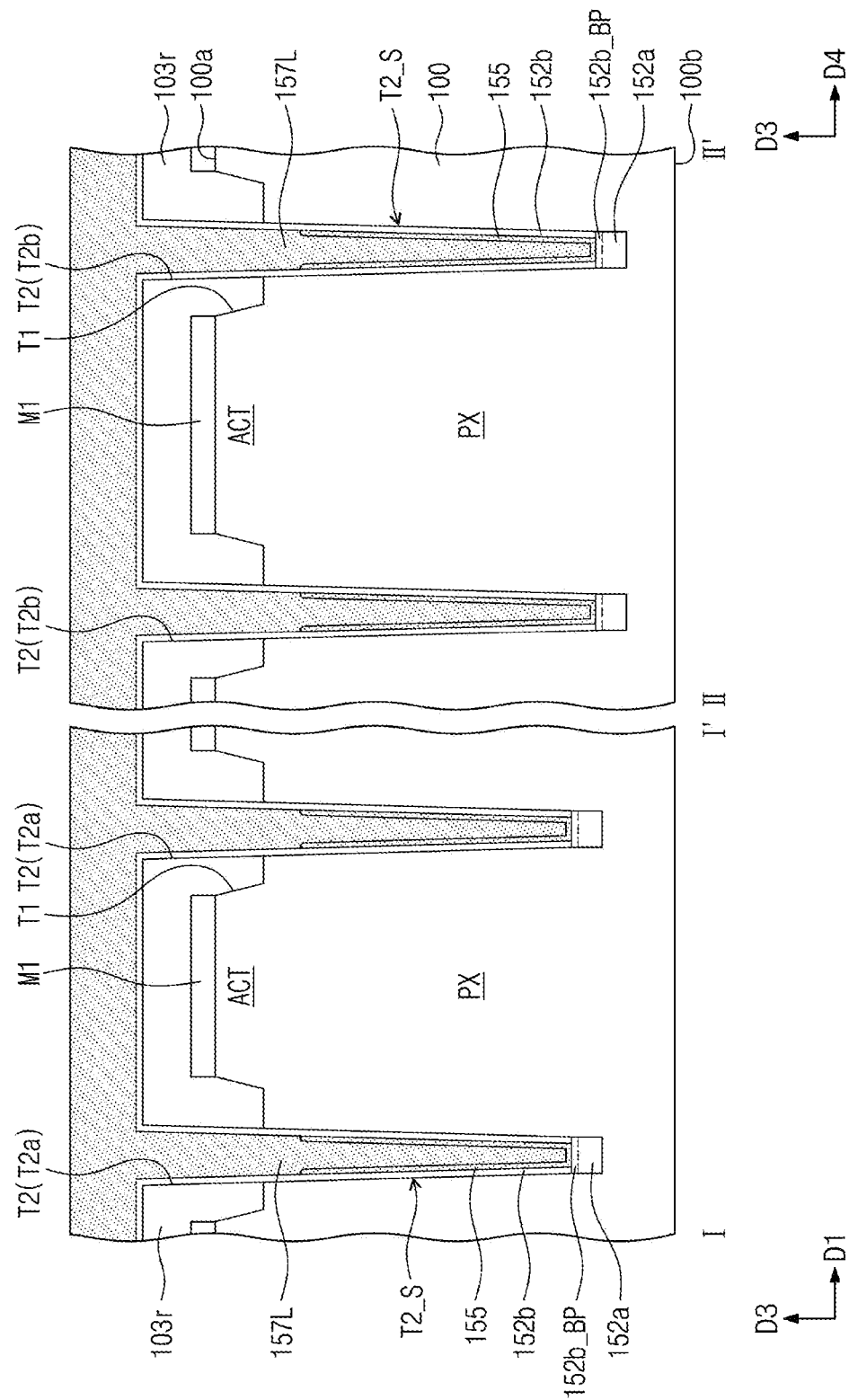

Referring to FIG. 11, the first semiconductor pattern 155 may be formed to fill a portion of the deep trench T2. In an embodiment of the inventive concept, the formation of the first semiconductor pattern 155 may include forming a first semiconductor layer on the sidewall insulating layer 152b to fill a portion of the deep trench T2 and anisotropically etching the first semiconductor layer. The anisotropic etching process may be performed to remove the first semiconductor layer from an upper region of the deep trench T2 and to expose the sidewall insulating layer 152b. The first semiconductor pattern 155 may be locally formed in a lower region of the deep trench T2. The first semiconductor pattern 155 may cover the bottom portion 152b_BP of the sidewall insulating layer 152b and may be extended along the sidewall insulating layer 152b on the side surface T2_S of the deep trench T2. In other words, the first semiconductor pattern 155 may cover the oxide layer 152a. The formation of the first semiconductor pattern 155 may further include injecting an impurity of the first conductivity type (e.g., a p-type impurity) into the first semiconductor pattern 155.

After the formation of the first semiconductor pattern 155, a semiconductor layer 157L may be formed on the sidewall insulating layer 152b to fill a remaining portion of the deep trench T2.

Figure 12:
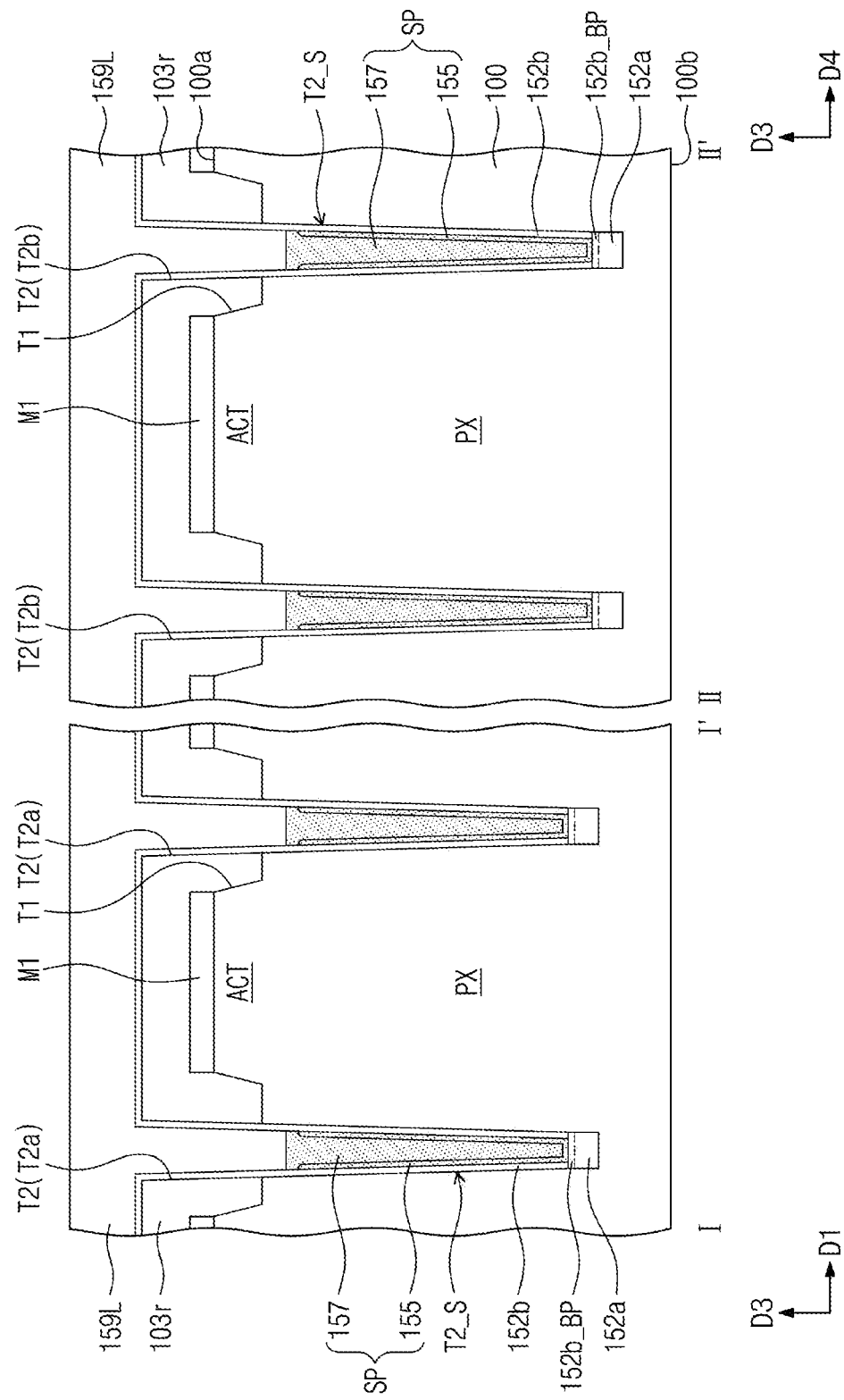

Referring to FIG. 12, the second semiconductor pattern 157 may be formed to fill a lower region of the deep trench T2. The formation of the second semiconductor pattern 157 may include recessing the semiconductor layer 157L. In an embodiment of the inventive concept, the recessing of the semiconductor layer 157L may be performed using an etch-back process. The recessing of the semiconductor layer 157L may be performed until the semiconductor layer 157L is locally left in the lower region of the deep trench T2. The second semiconductor pattern 157 may cover the topmost surface of the first semiconductor pattern 155 and may be in contact with the sidewall insulating layer 152b.

After the formation of the second semiconductor pattern 157, a thermal treatment process may be performed on the substrate 100. Accordingly, the impurity of the first conductivity type, which is injected into the first semiconductor pattern 155, may be diffused into the second semiconductor pattern 157. The first and second semiconductor patterns 155 and 157 may be referred to as the semiconductor pattern SP.

An insulating gapfill layer 159L may be formed on the substrate 100, in which the semiconductor pattern SP is formed, to fill a remaining portion of the deep trench T2.

Figure 13:
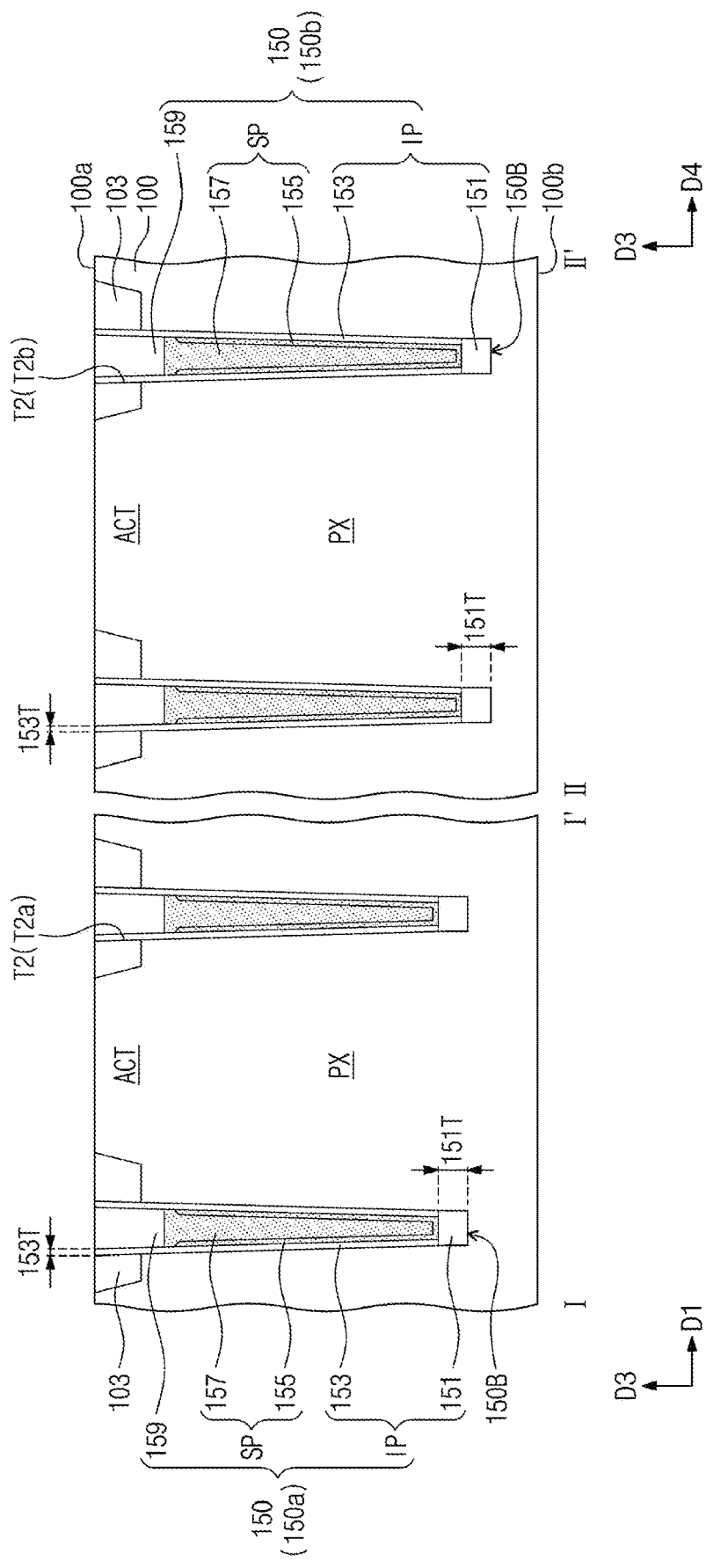

Referring to FIG. 13, the insulating gapfill pattern 159 may be formed to fill an upper region of the deep trench T2. The formation of the insulating gapfill pattern 159 may include planarizing the insulating gapfill layer 159L, the sidewall insulating layer 152b, and the device isolation layer 103r until the first surface 100a of the substrate 100 is exposed. The first mask pattern M1 may be removed by the planarization process. The surface of the insulating gapfill pattern 159 and the first surface 100a of the substrate 100 may be coplanar with each other. Since the insulating gapfill layer 159L, the sidewall insulating layer 152b, and the device isolation layer 103r are planarized, the insulating gapfill pattern 159, the insulating pattern IP, and the shallow isolation pattern 103 may be respectively formed. The bottom portion 152b_BP of the sidewall insulating layer 152b and the oxide layer 152a may be in direct contact with each other to constitute the bottom portion 151 of the insulating pattern IP. The sidewall insulating layer 152b on the side surface T2_S of the deep trench T2 may constitute the side portion 153 of the insulating pattern IP. The thickness 151T of the bottom portion 151 of the insulating pattern IP may be larger than the thickness 153T of the side portion 153 of the insulating pattern IP, as described with reference to FIGS. 4 to 6. The thickness 151T may be measured in the third direction D3 and the thickness 153T may be measured in the fourth direction D4. According to an embodiment of the inventive concept, before the formation of the sidewall insulating layer 152b, the oxide layer 152a may be locally formed in a portion of the substrate 100, which is exposed through the bottom surface T2_B of the deep trench T2. Accordingly, the bottom portion 151 of the insulating pattern IP may be thicker than the side portion 153 of the insulating pattern IP.

The insulating gapfill pattern 159, the insulating pattern IP, and the semiconductor pattern SP may constitute the deep isolation pattern 150, and the deep isolation pattern 150 may be interposed between the pixel regions PX. The bottom surface 150B of the deep isolation pattern 150 may be located at a height which is higher than the second surface 100b of the substrate 100. The bottom portion 151 of the insulating pattern IP may be adjacent to the bottom surface 150B of the deep isolation pattern 150. The bottom portion 151 of the insulating pattern IP in the second deep isolation pattern 150b may be located closer to the second surface 100b of the substrate 100 than the bottom portion 151 of the insulating pattern IP in the first deep isolation pattern 150a.

The deep isolation pattern 150 may include the first deep isolation pattern 150a and the second deep isolation pattern 150b, which are respectively formed in the first deep trench T2a and the second deep trench T2b. As described with reference to FIGS. 4 to 6, a vertical length of the second deep isolation pattern 150b may be larger than a vertical length of the first deep isolation pattern 150a. The bottom surface 150B of the first deep isolation pattern 150a and the bottom surface 150B of the second deep isolation pattern 150b may be located at a height that is higher than the second surface 100b of the substrate 100. The bottom surface 150B of the second deep isolation pattern 150b may be located at a height lower than the bottom surface 150B of the first deep isolation pattern 150a, when measured from the second surface 100b of the substrate 100.

Figure 14:
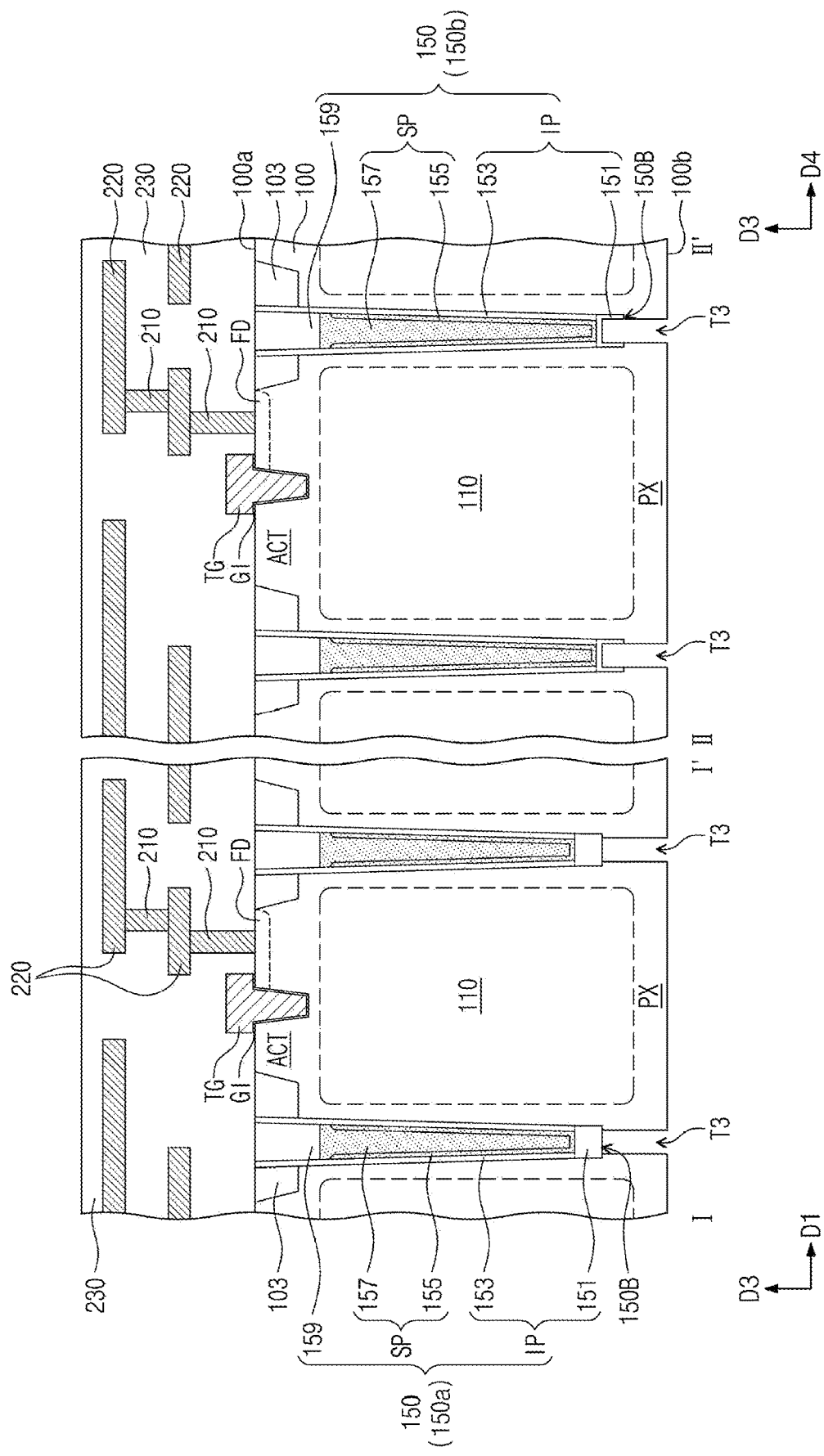

Referring to FIG. 14, the photoelectric conversion region 110 may be formed in each of the pixel regions PX. In an embodiment of the present disclosure, the formation of the photoelectric conversion region 110 may include injecting impurities, which are of the second conductivity type (e.g., n-type) different from the first conductivity type (e.g., p-type), into the substrate 100.

The transistors TX, RX, SX, and DX of FIG. 2 may be formed on the first surface 100a of the substrate 100 and on each of the pixel regions PX. In an embodiment of the present disclosure, the formation of the transfer transistor TX may include doping the active region ACT with an impurity to form the floating diffusion region FD and forming the transfer gate TG on the active region ACT. The formation of the drive transistor DX, the selection transistor SX, and the reset transistor RX may include doping the active region ACT with an impurity to form an impurity region and forming the drive gate SG, the selection gate SG, and the reset gate RG on the active region ACT.

The contact plugs 210, the interconnection patterns 220, and the interlayer insulating layer 230 may be formed on the first surface 100a of the substrate 100. The contact plugs 210 may be connected to the terminals of the transistors TX, RX, SX, and DX and may be connected to corresponding ones of the interconnection patterns 220. The interconnection patterns 220 may be electrically connected to the transistors TX, RX, SX, and DX through the contact plugs 210. The interlayer insulating layer 230 may be formed on the first surface 100a of the substrate 100 to cover the transistors TX, RX, SX, and DX, the contact plugs 210, and the interconnection patterns 220.

An isolation trench T3 may be formed in a portion of the substrate 100 near the second surface 100b. The isolation trench T3 may be overlapped with the deep isolation pattern 150 vertically (e.g., in the third direction D3). In an embodiment of the present disclosure, the formation of the isolation trench T3 may include forming a third mask pattern on the second surface 100b of the substrate 100 and etching the substrate 100 using the third mask pattern as an etch mask. The isolation trench T3 may be formed to expose the bottom surface 150B of the deep isolation pattern 150 or may be extended into the deep isolation pattern 150 through the bottom surface 150B.

The isolation trench T3 may be vertically overlapped with the first deep isolation pattern 150a in the third direction D3 and may expose the bottom surface 150B of the first deep isolation pattern 150a. The isolation trench T3 may expose a surface of the bottom portion 151 of the insulating pattern IP of the first deep isolation pattern 150a. In the first deep isolation pattern 150a, the bottom portion 151 of the insulating pattern IP may be interposed between the semiconductor pattern SP and the isolation trench T3. The isolation trench T3 may be vertically overlapped with the second deep isolation pattern 150b in the third direction D3 and may be extended into the second deep isolation pattern 150b through the bottom surface 150B. The isolation trench T3 may be extended into the bottom portion 151 of the insulating pattern IP of the second deep isolation pattern 150b. In an embodiment of the present disclosure, in the second deep isolation pattern 150b, a portion of the bottom portion 151 of the insulating pattern IP may remain between the semiconductor pattern SP and the isolation trench T3.

According to an embodiment of the inventive concept, since the bottom portion 151 of the insulating pattern IP is thicker than the side portion 153 of the insulating pattern IP, it is possible to prevent the isolation trench T3 from being extended into the semiconductor pattern SP or to prevent the semiconductor pattern SP from being recessed.

Figure 15:
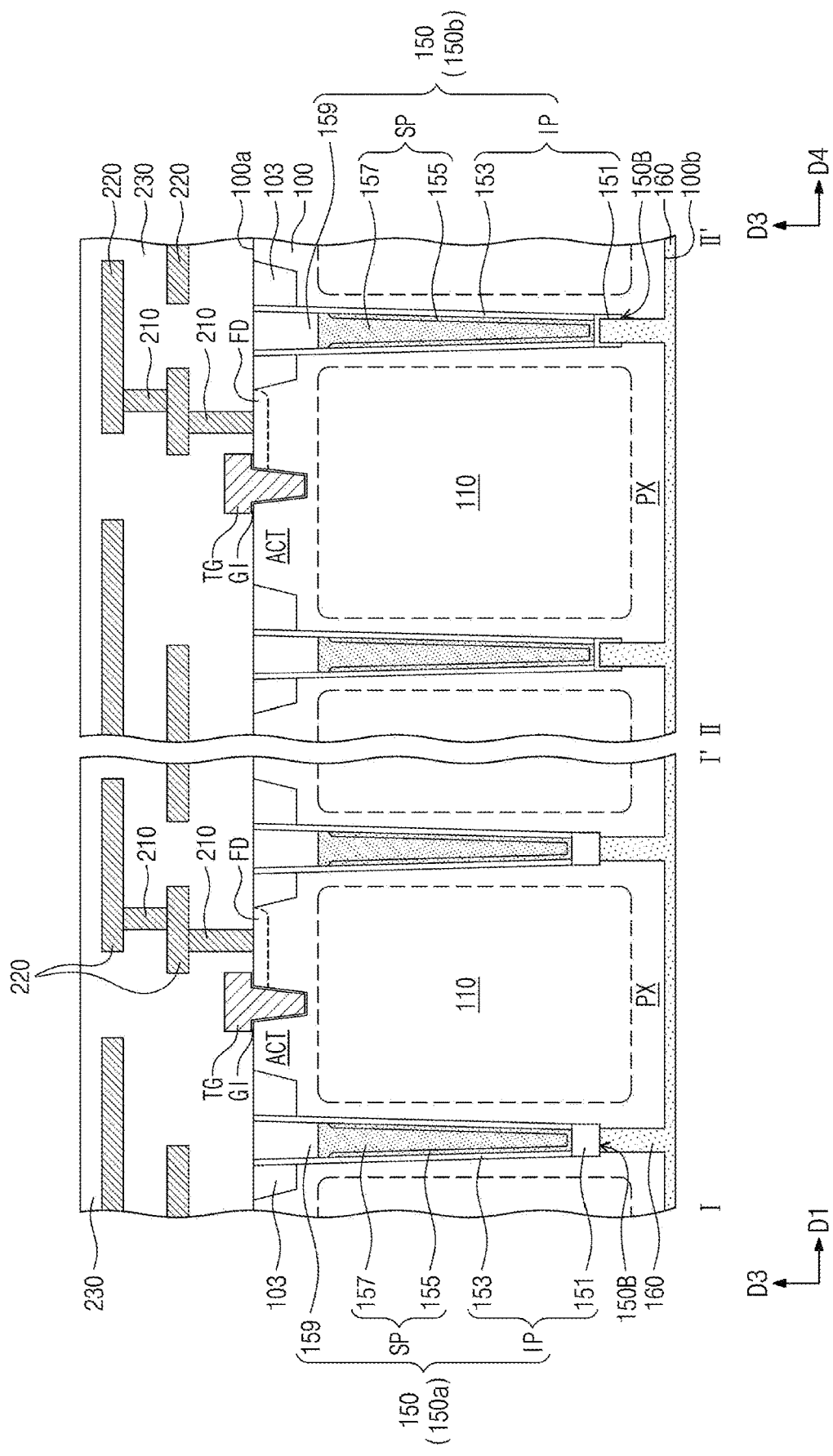

Referring to FIG. 15, the isolation pattern 160 may be formed on the second surface 100b of the substrate 100 to fill the isolation trench T3. In an embodiment of the present disclosure, the formation of the isolation pattern 160 may include forming an isolation layer on the second surface 100b of the substrate 100 to fill the isolation trench T3 and planarizing the isolation layer. In an embodiment of the present disclosure, the planarization of the isolation layer may be performed until the isolation layer has a predetermined thickness on the second surface 100b of the substrate 100.

The isolation pattern 160 may be overlapped with the deep isolation pattern 150 vertically (e.g., in the third direction D3). The deep isolation pattern 150 and the isolation pattern 160 may be disposed in the substrate 100 to separate the pixel regions PX from each other.

Referring back to FIGS. 3 and 4, the anti-reflection layer 310 and the first insulating layer 320 may be sequentially on the second surface 100b of the substrate 100 to cover the isolation pattern 160. The grid 330 may be formed on the first insulating layer 320 and may be vertically overlapped with the deep isolation pattern 150. In an embodiment of the present disclosure, the formation of the grid 330 may include depositing a metal layer on the first insulating layer 320 and patterning the metal layer. The color filter array 340 may be formed on the first insulating layer 320 to cover the grid 330. The color filter array 340 may include the color filters 340, which are respectively disposed on the pixel regions PX. The second insulating layer 350 may be formed on the color filter array 340, and the micro lens array 360 may be formed on the second insulating layer 350. The micro lens array 360 may include the micro lenses 360, which are respectively disposed on the color filters 340. Each of the micro lenses 360 may be formed to be overlapped with the photoelectric conversion region 110 of a corresponding one of the pixel regions PX vertically (e.g., in the third direction D3).

Figure 16:
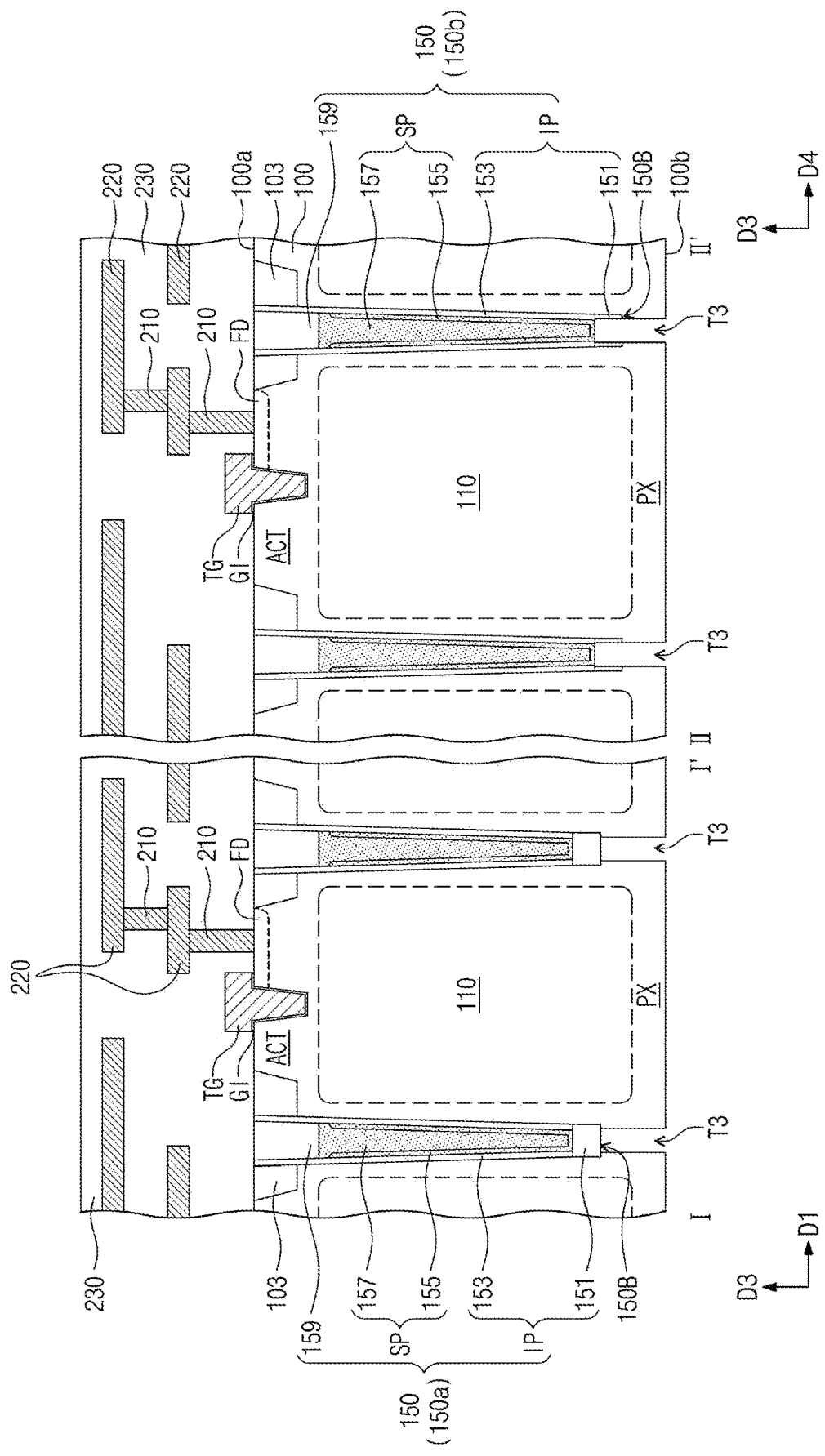
FIG. 16 is a sectional view illustrating a method of fabricating an image sensor according to an embodiment of the inventive concept and corresponding to the lines I-I' and II-II' of FIG. 3.

FIG. 16 is a sectional view illustrating a method of fabricating an image sensor according to an embodiment of the inventive concept and corresponding to the lines I-I' and II-II' of FIG. 3. For the sake of brevity, features, which are different from the fabrication method described with reference to FIGS. 8 to 15, will be mainly described below.

Referring to FIG. 16, the isolation trench T3 may be formed in a portion of the substrate 100 near the second surface 100b. The isolation trench T3 may be overlapped with the deep isolation pattern 150 vertically (e.g., in the third direction D3). The isolation trench T3 may expose the bottom surface 150B of the deep isolation pattern 150 or may be extended into the deep isolation pattern 150 through the bottom surface 150B of the deep isolation pattern 150.

The isolation trench T3 may be vertically overlapped with the first deep isolation pattern 150a in the third direction D3 and may expose the bottom surface 150B of the first deep isolation pattern 150a. The isolation trench T3 may expose a surface of the bottom portion 151 of the insulating pattern IP of the first deep isolation pattern 150a. In the first deep isolation pattern 150a, the bottom portion 151 of the insulating pattern IP may be interposed between the semiconductor pattern SP and the isolation trench T3. In other words, the bottom portion 151 of the insulating pattern IP may separate the semiconductor pattern SP and the isolation trench T3.

The isolation trench T3 may be vertically overlapped with the second deep isolation pattern 150b in the third direction D3 and may be extended into the second deep isolation pattern 150b through the bottom surface 150B of the deep isolation pattern 150. In an embodiment of the inventive concept, the isolation trench T3 may penetrate the bottom portion 151 of the insulating pattern IP of the second deep isolation pattern 150b and to expose the semiconductor pattern SP. For example, the isolation trench T3 may expose the first semiconductor pattern 155. According to an embodiment of the inventive concept, since the bottom portion 151 of the insulating pattern IP is thicker than the side portion 153 of the insulating pattern IP, it is possible to prevent the isolation trench T3 from being extended into the semiconductor pattern SP or to prevent the semiconductor pattern SP from being recessed.

Except for the afore-described differences, the fabrication method according to the present embodiment may be substantially the same as that described with reference to FIGS. 8 to 15.

Figure 17:
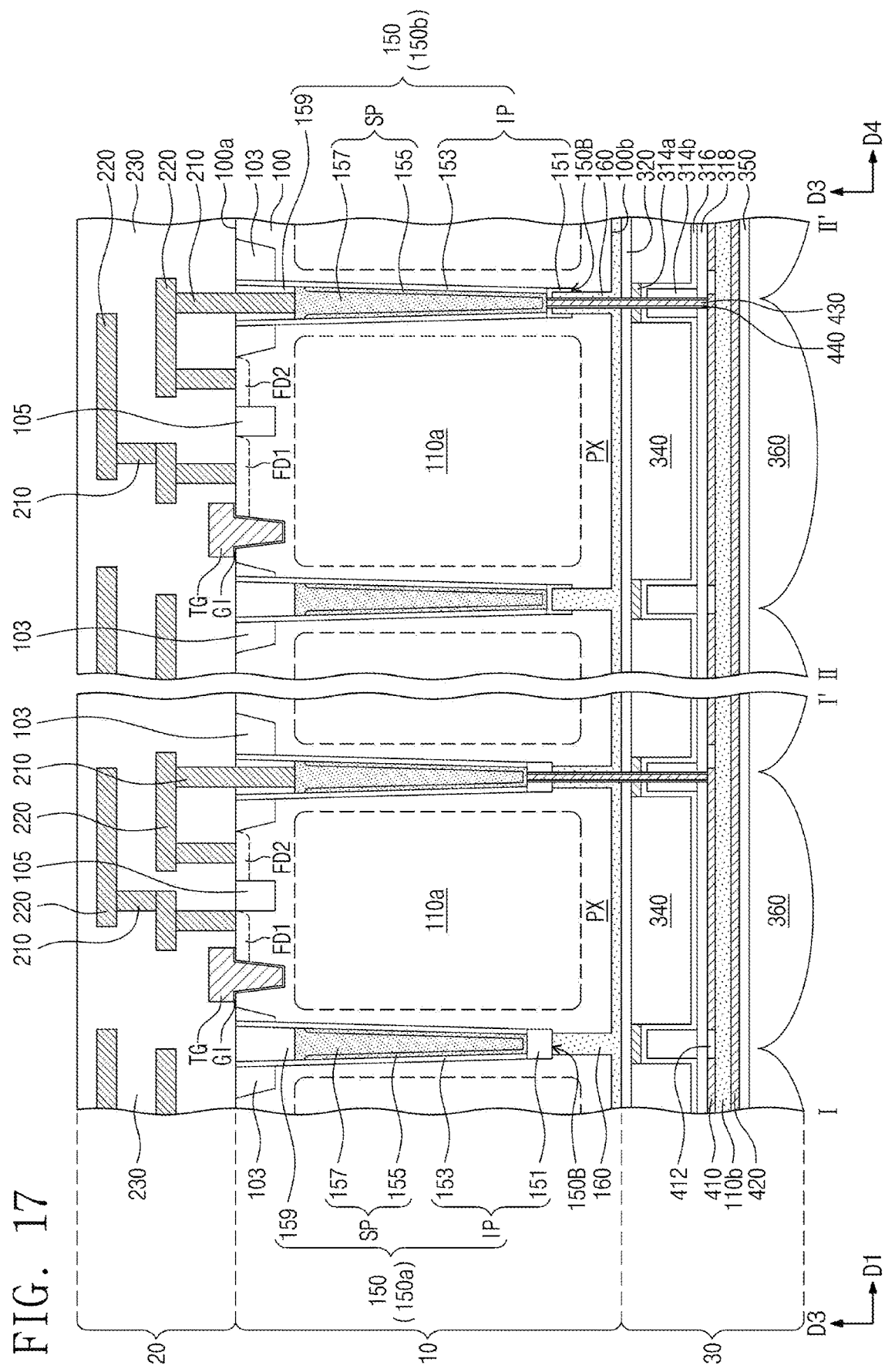
FIG. 17 is a sectional view illustrating an image sensor according to an embodiment of the inventive concept and corresponding to the lines I-I' and II-II' of FIG. 3.

FIG. 17 is a sectional view illustrating an image sensor according to an embodiment of the inventive concept and corresponding to the lines I-I' and II-II' of FIG. 3. For the sake of brevity, features, which are different from the image sensor described with reference to FIGS. 1 to 6, will be mainly described below.

Referring to FIG. 17, the photoelectric conversion layer 10 may include the substrate 100, which includes the pixel regions PX, and the deep isolation pattern 150 and the isolation pattern 160, which are provided in the substrate 100 and between the pixel regions PX. The deep isolation pattern 150 may include the semiconductor pattern SP, which penetrates a portion of the substrate 100, the insulating pattern IP, which is interposed between the semiconductor pattern SP and the substrate 100, and the insulating gapfill pattern 159, which is provided on the semiconductor pattern SP. The deep isolation pattern 150 and the isolation pattern 160 may be substantially the same as those in the previous embodiment described with reference to FIGS. 1 to 6.

The first and second shallow isolation patterns 103 and 105 may be disposed adjacent to the first surface 100a of the substrate 100. Each of the pixel regions PX may include the active region ACT, which is defined by the first shallow isolation pattern 103, and the second shallow isolation pattern 105 may be disposed in the active region ACT. The deep isolation pattern 150 may penetrate the first shallow isolation pattern 103 and may be extended into the substrate 100. As an example, the insulating gapfill pattern 159 of the deep isolation pattern 150 may be disposed in the first shallow isolation pattern 103. The insulating gapfill pattern 159 may penetrate the first shallow isolation pattern 103 and be in contact with the semiconductor pattern SP. The side portion 153 of the insulating pattern IP of the deep isolation pattern 150 may be extended into a region between the first shallow isolation pattern 103 and the insulating gapfill pattern 159.

The transfer transistor TX and the logic transistors RX, SX, and DX of FIG. 2 may be disposed on the first surface 100a of the substrate 100. The transfer transistor TX may include the transfer gate TG, which is provided on the active region ACT, and a first floating diffusion region FD1. The first floating diffusion region FD1 may be disposed in a portion of the active region ACT located at a side of the transfer gate TG. A second floating diffusion region FD2 may be disposed in the active region ACT, and the second shallow isolation pattern 105 may be interposed between the first floating diffusion region FD1 and the second floating diffusion region FD2. The first and second floating diffusion regions FD1 and FD2 may be impurity regions which are doped with impurities of the second conductivity type (e.g., n-type impurities) different from the first conductivity type of the substrate 100.

The interconnection layer 20 may be disposed on the first surface 100a of the substrate 100. The interconnection layer 20 may include the contact plugs 210, the interconnection patterns 220, and the interlayer insulating layer 230, which are disposed on the first surface 100a of the substrate 100. The contact plugs 210 may be connected to the terminals of the transistors TX, RX, SX, and DX. The first floating diffusion region FD1 may be connected to a corresponding one of the contact plugs 210 and may be electrically connected to corresponding ones of the interconnection patterns 220 through the corresponding contact plug 210. The semiconductor pattern SP of the deep isolation pattern 150 may be electrically connected to the second floating diffusion region FD2 through corresponding ones of the contact plugs 210 and corresponding ones of the interconnection patterns 220.

Each of the pixel regions PX may include a first photoelectric conversion region 110a. The first photoelectric conversion region 110a may be an impurity region which is doped with impurities of the second conductivity type (e.g., n-type impurities) different from the first conductivity type of the substrate 100. The first photoelectric conversion region 110a and the substrate 100 may form a pn junction serving as a photodiode.

The optically-transparent layer 30 may be disposed on the second surface 100b of the substrate 100. The optically-transparent layer 30 may include the color filter array 340 and the micro lens array 360, which are disposed on the second surface 100b of the substrate 100. The color filter array 340 may be disposed between the second surface 100b of the substrate 100 and the micro lens array 360. The color filter array 340 may include the color filters 340, which are respectively disposed on the pixel regions PX, and the micro lens array 360 may include the micro lenses 360, which are respectively disposed on the color filters 340.

The first insulating layer 320 may be disposed between the second surface 100b of the substrate 100 and the color filter array 340. The isolation pattern 160 may be extended to a region on the second surface 100b of the substrate 100 and may be interposed between the second surface 100b of the substrate 100 and the first insulating layer 320.

Light-blocking patterns 314a may be disposed on the first insulating layer 320 between the color filters 340. Low refractive patterns 314b may be disposed between the color filters 340 and on the light-blocking patterns 314a, respectively. A third insulating layer 316 may be interposed between each of the light-blocking patterns 314a and each of the low-refractive patterns 314b and may be extended into a region between each of the color filters 340 and each of the low-refractive patterns 314b. The third insulating layer 316 may be extended into a region between the micro lens array 360 and each of the color filters 340.

Pixel electrodes 410 may be disposed on the pixel regions PX, respectively. The pixel electrodes 410 may be disposed on the color filters 340, respectively, and the third insulating layer 316 may be interposed between the pixel electrodes 410 and the color filters 340. Electrode separation patterns 412 may be disposed between the pixel electrodes 410. A fourth insulating layer 318 may be disposed between the pixel electrodes 410 and the third insulating layer 316 and may be extended into regions between the electrode separation patterns 412 and the low refractive patterns 314b. The fourth insulating layer 318 may cover the pixel electrodes 410 and the electrode separation patterns 412.

A second photoelectric conversion layer 110b may be disposed on the pixel electrodes 410 and the electrode separation patterns 412, and a common electrode 420 may be disposed on the second photoelectric conversion layer 110b. The second photoelectric conversion layer 110b may be disposed between the pixel electrodes 410 and the common electrode 420 and between the electrode separation patterns 412 and the common electrode 420. The pixel electrodes 410, the electrode separation patterns 412, the second photoelectric conversion layer 110b, and the common electrode 420 may be disposed between the color filter array 340 and the micro lens array 360. The second photoelectric conversion layer 110b may be, for example, an organic photoelectric conversion layer. The second photoelectric conversion layer 110b may include a p-type organic semiconductor material and an n-type organic semiconductor material, which are provided to form a pn junction. Alternatively, the second photoelectric conversion layer 110b may include a quantum dot or a chalcogenide material. In an embodiment of the inventive concept, the pixel electrodes 410 and the common electrode 420 may be formed of or include at least one of indium tin oxide (ITO), indium zinc oxide (IZO), zinc oxide (ZnO), and/or organic transparent conductive materials.

Each of the pixel electrodes 410 may be electrically connected to the semiconductor pattern SP of the deep isolation pattern 150 by a via plug 430. The via plug 430 may be connected to the semiconductor pattern SP of the deep isolation pattern 150 and may penetrate the isolation pattern 160, the first insulating layer 320, a corresponding one of the light-blocking patterns 314a, the third insulating layer 316, a corresponding one of the low refractive patterns 314b, and the fourth insulating layer 318 and be connected to a corresponding one of the pixel electrodes 410. The semiconductor pattern SP of the deep isolation pattern 150 may be electrically connected to the second floating diffusion region FD2 through a corresponding one of the contact plugs 210 and a corresponding one of the interconnection patterns 220. A via barrier pattern 440 may be disposed on a side surface of the via plug 430. The via barrier pattern 440 may be interposed between the via plug 430 and each of the isolation pattern 160, the first insulating layer 320, the corresponding light-blocking pattern 314a, the third insulating layer 316, the corresponding low refractive pattern 314b, and the fourth insulating layer 318.

The second insulating layer 350 may be interposed between the common electrode 420 and the micro lens array 360. The first to fourth insulating layers 320, 350, 316, and 318 and the electrode separation patterns 412 may be formed of or include at least one of silicon oxide, silicon nitride, and/or silicon oxynitride.

Except for the afore-described differences, the image sensor according to the present embodiment may be substantially the same as the image sensor described with reference to FIGS. 1 to 6.

Figure 18:
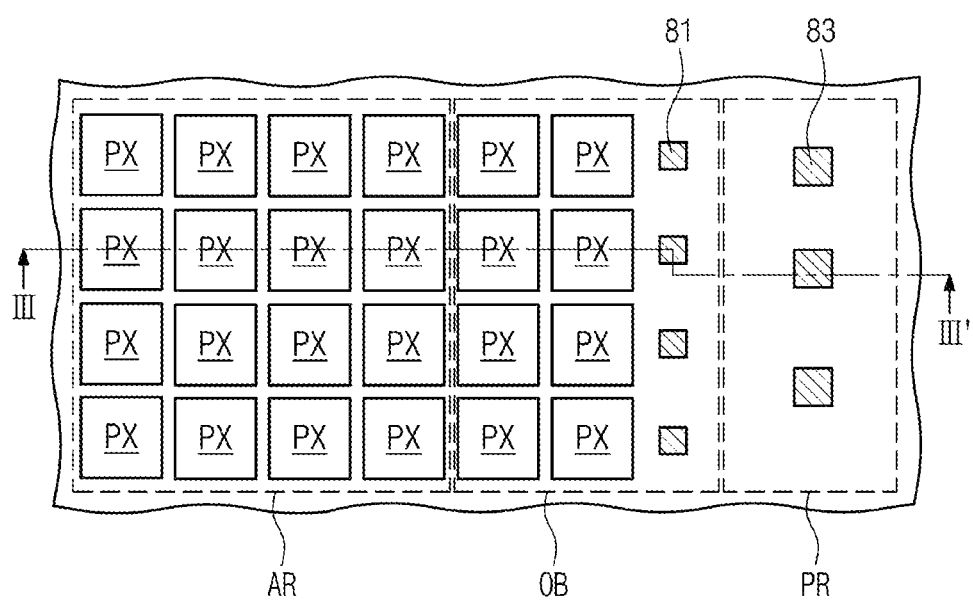
FIG. 18 is a plan view illustrating an image sensor according to an embodiment of the inventive concept.
Figure 19:
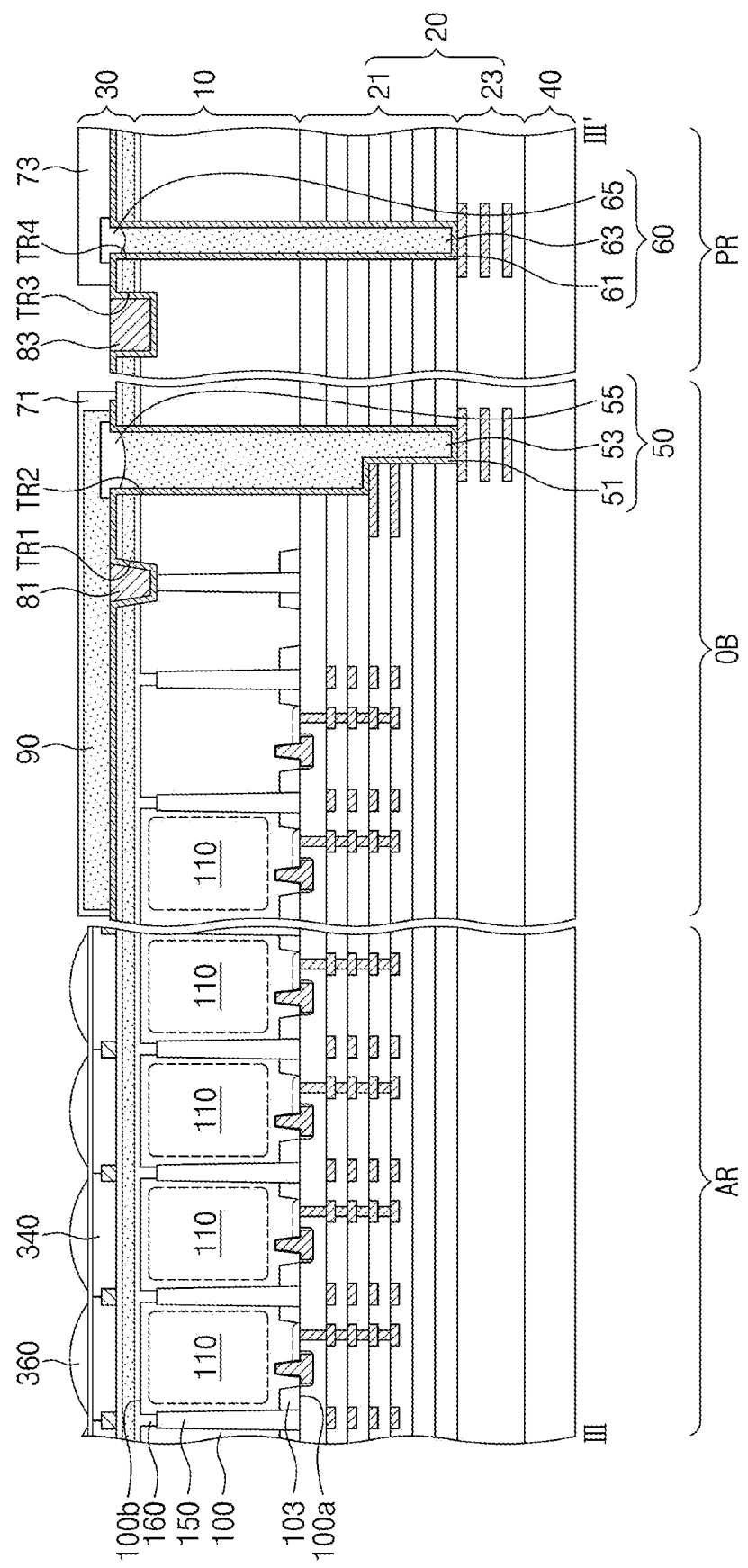
FIG. 19 is a sectional view taken along a line III-III' of FIG. 18.

FIG. 18 is a plan view illustrating an image sensor according to an embodiment of the inventive concept, and FIG. 19 is a sectional view taken along the line III-III of FIG. 18. For the sake of brevity, the same element as in the image sensor previously described with reference to FIGS. 1 to 6 may be identified by the same reference number without repeating an overlapping description thereof.

Referring to FIGS. 18 and 19, an image sensor may include the substrate 100, which includes a pixel array region AR, an optical black region OB, and a pad region PR, the interconnection layer 20, which is provided on the first surface 100a of the substrate 100, a base substrate 40, which is provided on the interconnection layer 20, and the optically-transparent layer 30, which is provided on the second surface 100b of the substrate 100. The interconnection layer 20 may be disposed between the first surface 100a of the substrate 100 and the base substrate 40. The interconnection layer 20 may include an upper interconnection layer 21, which is adjacent to the first surface 100a of the substrate 100, and a lower interconnection layer 23, which is between the upper interconnection layer 21 and the base substrate 40. The pixel array region AR may include the pixel regions PX and the deep isolation pattern 150 and the isolation pattern 160, which are disposed between the pixel regions PX. The pixel array region AR may be configured to have substantially the same features as that in the image sensor described with reference to FIGS. 1 to 7 and FIG. 17. As an example, the deep isolation pattern 150 and the isolation pattern 160 may be substantially the same as those in the previous embodiment described with reference to FIGS. 1 to 7 and FIG. 17.

A first connection structure 50, a first contact 81, and a bulk color filter 90 may be disposed on the optical black region OB of the substrate 100. The first connection structure 50 may include a first light-blocking pattern 51, a first isolation pattern 53, and a first capping pattern 55. The first light-blocking pattern 51 may be disposed on the second surface 100b of the substrate 100. For example, the first light-blocking pattern 51 may be in direct contact with the second surface 100b of the substrate 100. The first light-blocking pattern 51 may cover the first insulating layer 320 and may conformally cover an inner surface of each of first and second trenches TR1 and TR2. The first light-blocking pattern 51 may penetrate the photoelectric conversion layer 10 and the upper interconnection layer 21. The first light-blocking pattern 51 may be connected to the semiconductor pattern SP of the deep isolation pattern 150 of the photoelectric conversion layer 10 and may be connected to interconnection lines in the upper and lower interconnection line layers 21 and 23. Accordingly, the first connection structure 50 may electrically connect the photoelectric conversion layer 10 to the interconnection layer 20. The first light-blocking pattern 51 may be formed of or include at least one of metallic materials (e.g., tungsten). The first light-blocking pattern 51 may block light which is incident into the optical black region OB.

The first contact 81 may fill a remaining portion of the first trench TR1. The first contact 81 may be formed of or include at least one of metallic materials (e.g., aluminum). The first contact 81 may be connected to the semiconductor pattern SP of the deep isolation pattern 150. A bias may be applied to the semiconductor pattern SP through the first contact 81. The first isolation pattern 53 may fill a remaining portion of the second trench TR2. The first isolation pattern 53 may penetrate the photoelectric conversion layer 10 and to penetrate a portion of the interconnection layer 20. The first isolation pattern 53 may be formed of or include at least one of insulating materials. The first capping pattern 55 may be disposed on the first isolation pattern 53. For example, the first capping pattern 55 may be disposed in a recess formed on an upper surface of the first isolation pattern 53. The first capping pattern 55 may be formed of or include the same material as the insulating gapfill pattern 159 of FIG. 4.

The bulk color filter 90 may be disposed on the first connection structure 50 and the first contact 81. The bulk color filter 90 may cover the first connection structure 50 and the first contact 81. A first protection layer 71 may be disposed on the bulk color filter 90 to hermetically seal the bulk color filter 90.

An additional photoelectric conversion region 110 may be provided in a corresponding pixel region PX of the optical black region OB. The additional photoelectric conversion region 110 may be an impurity region that is doped to have the second conductivity type (e.g., the n-type) different from the first conductivity type of the substrate 100. The additional photoelectric conversion region 110 may have a structure that is similar to the photoelectric conversion regions PD, which are provided in the pixel regions PR of the pixel array region AR, but may not perform the operation of generating electrical signals from light, unlike the photoelectric conversion regions 110.

A second connection structure 60, a second contact 83, and a second protection layer 73 may be disposed on the pad region PR of the substrate 100. The second connection structure 60 may include a second light-blocking pattern 61, a second isolation pattern 63, and a second capping pattern 65.

The second light-blocking pattern 61 may be disposed on the second surface 100b of the substrate 100. The second light-blocking pattern 61 may cover the first insulating layer 320 and may conformally cover an inner surface of each of third and fourth trenches TR3 and TR4. The second light-blocking pattern 61 may penetrate the photoelectric conversion layer 10 and the upper interconnection layer 21. The second light-blocking pattern 61 may be connected to the interconnection lines in the lower interconnection layer 23. Accordingly, the second connection structure 60 may electrically connect the photoelectric conversion layer 10 and the interconnection layer 20. The second light-blocking pattern 61 may be formed of or include at least one of metallic materials (e.g., tungsten). The second light-blocking pattern 61 may block light which is incident into the pad region PR.

The second contact 83 may fill a remaining portion of the third trench TR3. The second contact 83 may be formed of or include at least one of metallic materials (e.g., aluminum). The second contact 83 may serve as an electric connection path between the image sensor and an external device. The second isolation pattern 63 may fill a remaining portion of the fourth trench TR4. The second isolation pattern 63 may penetrate the photoelectric conversion layer 10 and may penetrate a portion of the interconnection layer 20. The second isolation pattern 63 may be formed of or include at least one of insulating materials. The second capping pattern 65 may be disposed on the second isolation pattern 63. The second capping pattern 65 may be formed of or include the same material as the insulating gapfill pattern 159 of FIG. 4. The second protection layer 73 may cover the second connection structure 60.

A current, which is applied through the second contact 83, may be supplied to the semiconductor pattern SP of the deep isolation pattern 150 through the second light-blocking pattern 61, the interconnection lines in the interconnection layer 20, and the first light-blocking pattern 51. Electrical signals, which are generated from the photoelectric conversion regions 110 in the pixel regions PX of the pixel array region AR, may be transmitted to the outside through the interconnection lines in the interconnection layer 20, the second light-blocking pattern 61, and the second contact 83.

According to an embodiment of the inventive concept, an image sensor may include a deep isolation pattern and an isolation pattern, which are disposed in a substrate and between a plurality of pixel regions. The deep isolation pattern may include a semiconductor pattern, which penetrates a portion of the substrate, and an insulating pattern, which is provided between the semiconductor pattern and the substrate. The insulating pattern may include a side portion on a side surface of the semiconductor pattern and a bottom portion on a bottom surface of the semiconductor pattern. A thickness of the bottom portion of the insulating pattern may be larger than a thickness of the side portion of the insulating pattern. The isolation pattern may be vertically overlapped with the deep isolation pattern. Since the bottom portion of the insulating pattern is thicker than the side portion of the insulating pattern, it is possible to prevent the isolation pattern from being extended into the semiconductor pattern and to prevent the semiconductor pattern from being recessed. Accordingly, it is possible to stably apply a negative bias to the semiconductor pattern and thereby to reduce a dark current in the image sensor.

In addition, since the deep isolation pattern and the isolation pattern are disposed between the pixel regions to be vertically overlapped with each other, an increase in an aspect ratio of the deep isolation pattern may be suppressed. Thus, it is possible to easily increase an integration density of the image sensor.

While example embodiments of the inventive concept have been particularly shown and described, it will be understood by one of ordinary skill in the art that variations in form and detail may be made thereto without departing from the spirit and scope of the attached claims.

What is claimed is:
1. An image sensor, comprising:
a substrate having a first surface and a second surface, which are opposite to each other, and a plurality of pixel regions; and
a deep isolation pattern extended from the first surface into the substrate and interposed between the plurality of pixel regions,
wherein the deep isolation pattern comprises a semiconductor pattern penetrating the substrate and an insulating pattern interposed between the substrate and the semiconductor pattern,
the insulating pattern comprises a side portion on a side surface of the semiconductor pattern and a bottom portion on a bottom surface of the semiconductor pattern,
the bottom portion of the insulating pattern has a first thickness, which is measured from the bottom surface of the semiconductor pattern in a direction perpendicular to the second surface of the substrate,
the side portion of the insulating pattern has a second thickness, which is measured from the side surface of the semiconductor pattern in a direction parallel to the second surface of the substrate,
the first thickness is larger than the second thickness, and
a portion of the bottom portion of the insulating pattern protrudes toward the first surface of the substrate such that the portion of the bottom portion of the insulating pattern is horizontally overlapped with a lower portion of the side portion of the insulating pattern.

2. The image sensor of claim 1, wherein a bottom surface of the deep isolation pattern is above the second surface of the substrate, and
the bottom portion of the insulating pattern is adjacent to the bottom surface of the deep isolation pattern.

3. The image sensor of claim 2, further comprising an isolation pattern extended from the second surface into the substrate and interposed between the plurality of pixel regions,
wherein the isolation pattern is overlapped by the deep isolation pattern in the direction perpendicular to the second surface of the substrate.

4. The image sensor of claim 3, wherein the isolation pattern is in contact with the bottom surface of the deep isolation pattern or is partially surrounded by the bottom portion of the insulating pattern.

5. The image sensor of claim 4, wherein a portion of the bottom portion of the insulating pattern is interposed between the semiconductor pattern and the isolation pattern.

6. The image sensor of claim 5, wherein the isolation pattern comprises a metallic element.

7. The image sensor of claim 3, wherein the deep isolation pattern comprises a first deep isolation pattern and a second deep isolation pattern, and
a bottom surface of the second deep isolation pattern is located at a height lower than the bottom surface of the first deep isolation pattern, when measured from the second surface of the substrate.

8. The image sensor of claim 7, wherein the isolation pattern is overlapped with the first deep isolation pattern in the direction perpendicular to the second surface of the substrate and is in contact with the bottom surface of the first deep isolation pattern.

9. The image sensor of claim 7, wherein the isolation pattern is overlapped with the second deep isolation pattern in the direction perpendicular to the second surface of the substrate, and is extended into the bottom portion of the insulating pattern of the second deep isolation pattern.

10. The image sensor of claim 9, wherein, in the second deep isolation pattern, the bottom portion of the insulating pattern is partially interposed between the isolation pattern and the semiconductor pattern.

11. The image sensor of claim 3, further comprising a shallow isolation pattern, which is disposed adjacent to the first surface of the substrate,
wherein the deep isolation pattern further comprises an insulating gapfill pattern, which is disposed on the semiconductor pattern and penetrates the shallow isolation pattern, and
the side portion of the insulating pattern is disposed between the shallow isolation pattern and the insulating gapfill pattern.

12. The image sensor of claim 11, further comprising:
an interconnection layer disposed on the first surface of the substrate, the interconnection layer comprising interconnection patterns;
a micro lens array disposed on the second surface of the substrate; and
a color filter array between the second surface of the substrate and the micro lens array.

13. An image sensor, comprising:
a substrate having a first surface and a second surface, which are opposite to each other, and a plurality of pixel regions, which are arranged in a first direction and a second direction that are parallel to the second surface and cross each other;
a deep isolation pattern extended from the first surface into the substrate in a third direction perpendicular to the second surface and interposed between the plurality of pixel regions; and
an isolation pattern extended from the second surface into the substrate in the third direction and interposed between the plurality of pixel regions,
wherein the deep isolation pattern and the isolation pattern are overlapped with each other in the third direction,
the deep isolation pattern comprises a semiconductor pattern, which penetrates the substrate, and an insulating pattern, which is extended along a side surface and a bottom surface of the semiconductor pattern,
the insulating pattern comprises a side portion on the side surface of the semiconductor pattern and a bottom portion on the bottom surface of the semiconductor pattern,
the bottom portion of the insulating pattern has a first thickness measured from the bottom surface of the semiconductor pattern in the third direction,
the side portion of the insulating pattern has a second thickness measured from the side surface of the semiconductor pattern in a direction parallel to the second surface of the substrate,
the first thickness is larger than the second thickness, and
a portion of the bottom portion of the insulating pattern protrudes toward the first surface of the substrate such that the portion of the bottom portion of the insulating pattern is horizontally overlapped with a lower portion of the side portion of the insulating pattern.

14. The image sensor of claim 13, wherein the deep isolation pattern comprises a first deep isolation pattern and a second deep isolation pattern, and
a bottom surface of the second deep isolation pattern is located at a height lower than a bottom surface of the first deep isolation pattern, when measured from the second surface of the substrate in the third direction.

15. The image sensor of claim 14, wherein the isolation pattern is overlapped by the first deep isolation pattern in the third direction and is in contact with the bottom surface of the first deep isolation pattern.

16. The image sensor of claim 15, wherein, in the first deep isolation pattern, the bottom portion of the insulating pattern is interposed between the semiconductor pattern and the isolation pattern.

17. The image sensor of claim 14, wherein the isolation pattern is overlapped by the second deep isolation pattern in the third direction, and is extended into the bottom portion of the insulating pattern of the second deep isolation pattern.

18. The image sensor of claim 17, wherein, in the second deep isolation pattern, the bottom portion of the insulating pattern is partially interposed between the semiconductor pattern and the isolation pattern.

19. The image sensor of claim 14, wherein
a vertical length of the second deep isolation pattern in the third direction is larger than a vertical length of the first deep isolation pattern in the third direction.

20. The image sensor of claim 14, wherein the first deep isolation pattern has a line shape, which extends in the second direction, between adjacent pixel regions in the first direction or has a line shape, which extends in the first direction, between adjacent pixel regions in the second direction, and
the second deep isolation pattern is provided at an intersection between the first deep isolation pattern extending in the first direction and the first deep isolation pattern extending in the second direction.

* * * * *